United States Patent
Krichevsky et al.

(10) Patent No.: US 12,253,723 B2
(45) Date of Patent: Mar. 18, 2025

(54) SHALLOW-PROFILE OPTICAL ELEMENTS FOR PHOTONICS RECEIVERS

(71) Applicant: Intel Corporation, Santa Clara, CA (US)

(72) Inventors: Alexander Krichevsky, Cupertino, CA (US); John M. Heck, Berkeley, CA (US)

(73) Assignee: Intel Corporation, Santa Clara, CA (US)

( * ) Notice: Subject to any disclaimer, the term of this patent is extended or adjusted under 35 U.S.C. 154(b) by 829 days.

(21) Appl. No.: 17/120,039

(22) Filed: Dec. 11, 2020

(65) Prior Publication Data

US 2021/0132306 A1 May 6, 2021

(51) Int. Cl.
  *G02B 6/42* (2006.01)
  *H01L 25/16* (2023.01)
  *H01L 31/0203* (2014.01)

(52) U.S. Cl.
  CPC ......... *G02B 6/4214* (2013.01); *G02B 6/4206* (2013.01); *G02B 6/4242* (2013.01); *H01L 25/167* (2013.01); *H01L 31/0203* (2013.01)

(58) Field of Classification Search
  None
  See application file for complete search history.

(56) References Cited

U.S. PATENT DOCUMENTS

| | | | |
|---|---|---|---|
| 5,633,527 A * | 5/1997 | Lear .................. | H01L 31/02327 372/50.23 |
| 6,733,189 B2 * | 5/2004 | Hurt ....................... | G02B 6/426 385/39 |
| 7,045,089 B2 * | 5/2006 | Afromowitz .... | B29D 11/00432 264/494 |
| 9,793,424 B2 * | 10/2017 | Cho ..................... | G02B 6/4209 |
| 10,481,334 B2 * | 11/2019 | Israel ....................... | G02B 6/30 |
| 10,488,605 B1 * | 11/2019 | Budd ................... | G02B 6/4296 |
| 10,866,367 B2 * | 12/2020 | Borrelli ............... | G02B 6/3854 |
| 11,531,171 B2 * | 12/2022 | Menezo ............... | G02B 6/4206 |
| 11,894,474 B2 * | 2/2024 | Dobriyal ............. | G02B 3/0056 |

(Continued)

FOREIGN PATENT DOCUMENTS

| | | | | |
|---|---|---|---|---|
| CN | 110637246 A | * | 12/2019 | ............... G02B 6/34 |
| JP | 2004302459 A | | 10/2004 | |

OTHER PUBLICATIONS

U.S. Appl. No. 17/561,286, filed Dec. 23, 2021; 38 pages.
(Continued)

*Primary Examiner* — Rhonda S Peace
(74) *Attorney, Agent, or Firm* — Alliance IP, LLC

(57) ABSTRACT

An optical system can include a optical receiver comprising an optical waveguide, an optical lid adjacent the waveguide, and a reflective surface proximate an output of the optical waveguide to direct light from the waveguide towards an output of the optical lid. The optical system can also include a photodetector (PD) die comprising a substrate, a concave mirror, and a photodetector. The concave mirror is formed on a first side of the substrate and the photodetector is disposed on a second side of the substrate, the first side opposite the second side, wherein the photodetector is disposed on the second side of the PD die offset from the optical axis of the optical element.

21 Claims, 21 Drawing Sheets

(56) References Cited

U.S. PATENT DOCUMENTS

| | | | |
|---|---|---|---|
| 2004/0223761 A1* | 11/2004 | Kropp | G02B 6/4246 |
| | | | 398/41 |
| 2006/0239605 A1 | 10/2006 | Palen et al. | |
| 2007/0293044 A1 | 12/2007 | Perozziello et al. | |
| 2012/0141143 A1* | 6/2012 | Hayashi | G02B 6/4206 |
| | | | 398/201 |
| 2016/0049528 A1 | 2/2016 | Cho et al. | |
| 2018/0031791 A1 | 2/2018 | Israel et al. | |
| 2018/0045891 A1 | 2/2018 | Israel et al. | |
| 2018/0335566 A1* | 11/2018 | Menezo | G02B 6/34 |
| 2019/0123109 A1* | 4/2019 | Xie | G02B 27/0955 |
| 2020/0168749 A1 | 5/2020 | Nishimura et al. | |
| 2020/0278508 A1 | 9/2020 | Israel et al. | |
| 2021/0003777 A1 | 1/2021 | Israel et al. | |
| 2021/0058159 A1 | 2/2021 | Krichevsky et al. | |
| 2021/0132306 A1* | 5/2021 | Krichevsky | G02B 6/4214 |
| 2021/0165165 A1 | 6/2021 | Israel et al. | |

OTHER PUBLICATIONS

U.S. Appl. No. 17/561,694, filed Dec. 23, 2021; 36 pages.

Butkute, Agne et al., "Optimization of Selective Laser Etching (SLE) for Glass Micromechanical Structure Fabrication," Optics Express 23487, vol. 29, No. 15/19, Jul. 2021 (13 pages).

Marchetti, Riccardo et al., "Coupling Strategies for Silicon Photonics Integrated Chips [Invited]," Photonics Research 201, Vo. 7, No. 2/ Feb. 2019 (39 pages).

U.S. Appl. No. 17/869,372, filed Jul. 20, 2022, inventors Nicholas D. Psaila et al.

U.S. Appl. No. 17/871,647, filed Jul. 22, 2022, inventor Nicholas D. Psaila.

EPO; Extended European Search Report issued in EP Patent Application No. 21197110.6, dated Mar. 28, 2022; 8 pages.

EPO; Office Action issued in EP Patent Application No. 21197110.6, dated Jan. 8, 2025; 6 pages.

* cited by examiner

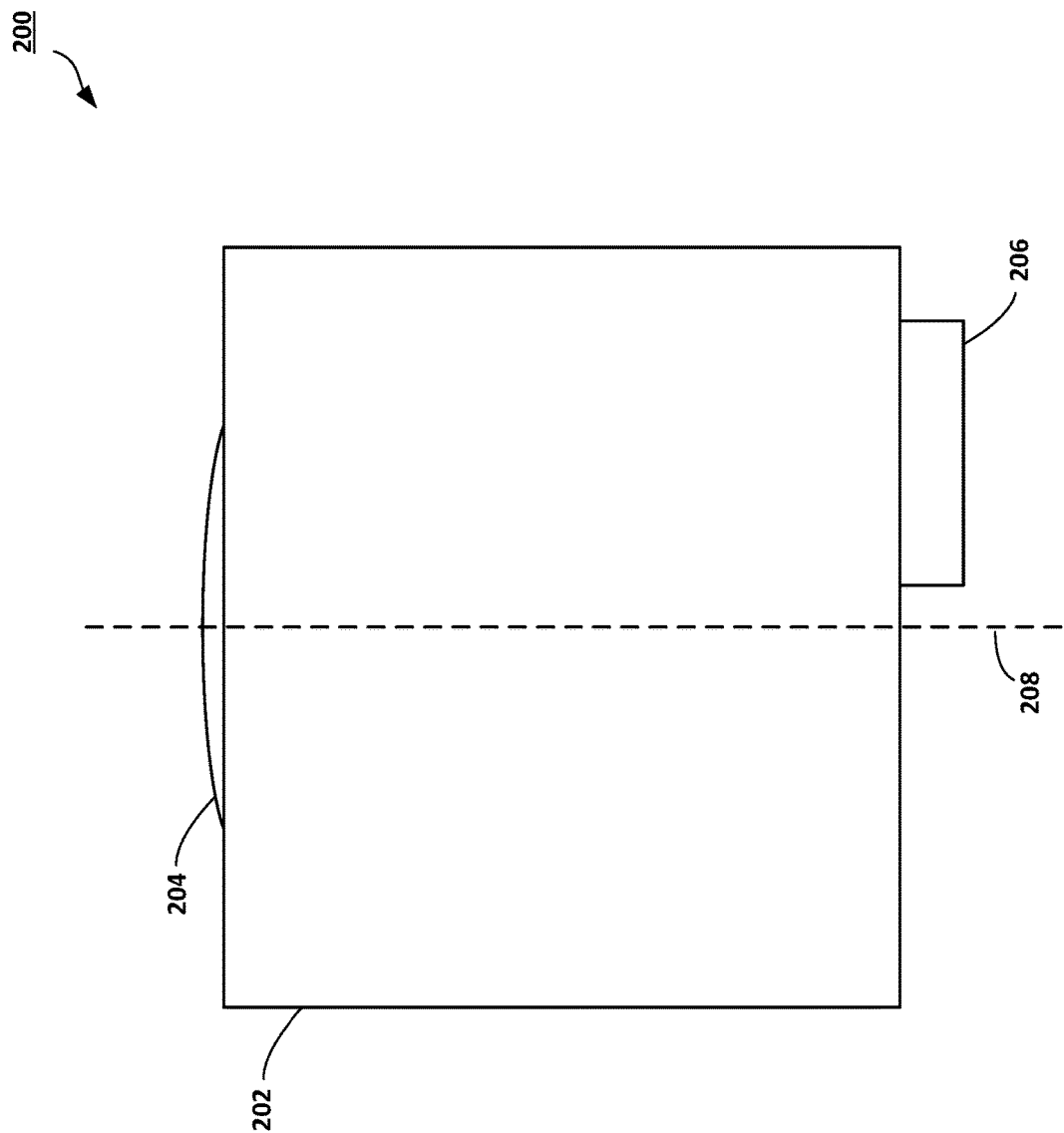

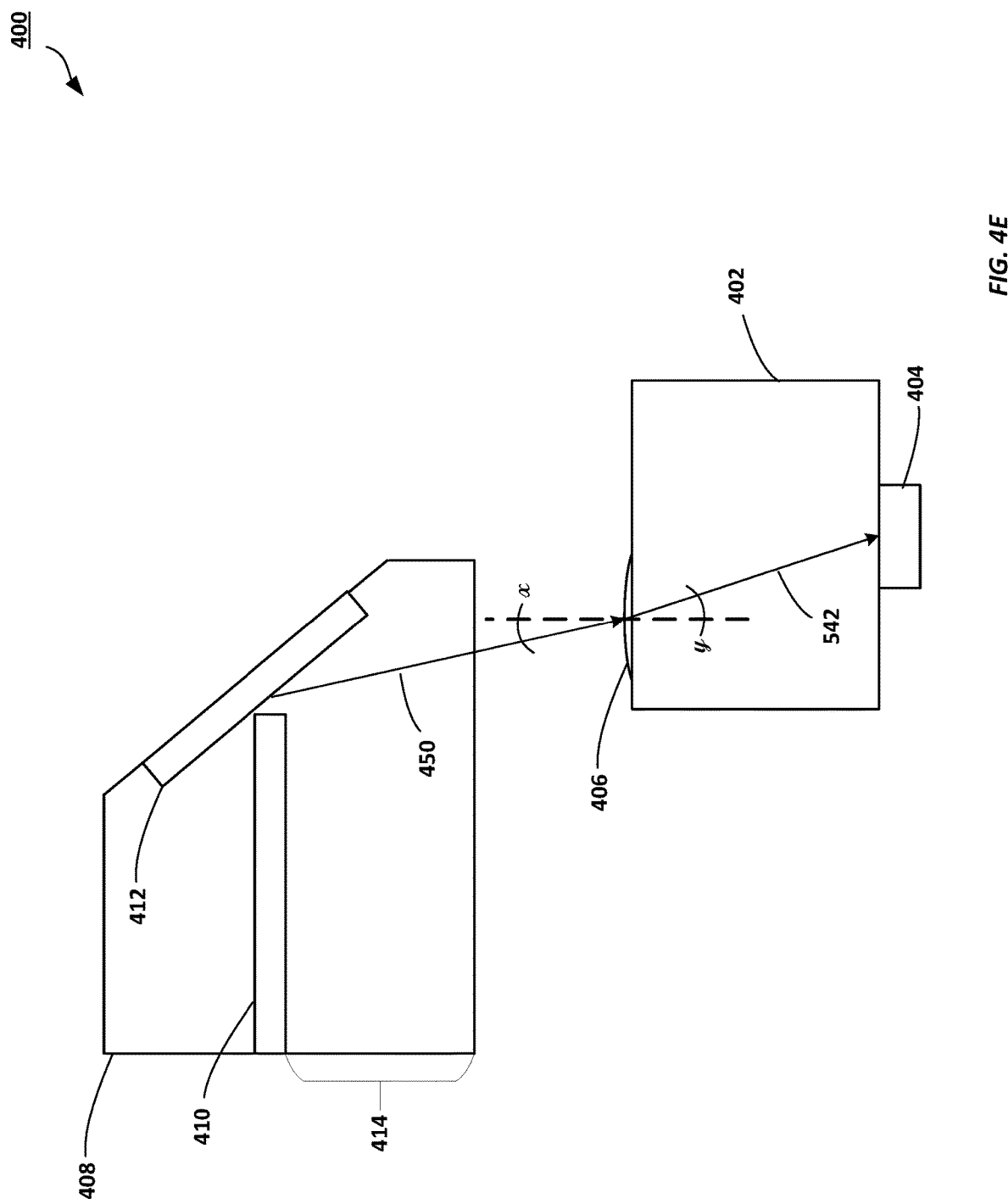

SHALLOW-PROFILE OPTICAL ELEMENTS FOR PHOTONICS RECEIVERS

BACKGROUND

Optical-based technologies can facilitate fast and efficient communications data traffic. In optical communications, information is transmitted by way of an optical carrier whose frequency typically is in the visible or near-infrared region of the electromagnetic spectrum. A carrier with such a high frequency is sometimes referred to as an optical signal, an optical carrier, a light wave signal, or, simply, light. An optical communications network can include several optical fibers, each of which may include several channels. A channel is a specified frequency band of an electromagnetic signal.

BRIEF DESCRIPTION OF THE DRAWINGS

FIGS. 2A-C are schematic block diagrams of example optical assemblies that include shallow profile optical elements in accordance with embodiments of the present disclosure.

FIGS. 4A-E are schematic diagrams of an example optical receiver assembly in accordance with embodiments of the present disclosure.

Figures are not drawn to scale.

DETAILED DESCRIPTION

Technological advances today enable implementing portions of optical communication systems at the integrated circuit (IC) (or chip) level, which provides advantages for use of optical communications in computer systems. For example, an optical receiver used in an optical communication system may include a photodetector (PD) implemented on a chip. Photodiodes may be used as PDs to detect light by converting incident light into an electrical signal. An electrical circuit may be coupled to the PD to receive the electrical signal representing the incident light. The electrical circuit may then process the electrical signal in accordance with the desired application.

Packaging of a PD implemented on a chip is not trivial. One challenge resides in the fact that, to achieve high-speed operation for a PD, for example 25 gigabit per second (Gb/s) and beyond, the small active area of the PD makes efficient coupling of light from an optical input device (e.g., a waveguide) difficult. Optical misalignment between the optical input device and the PD can significantly compromise such coupling. This disclosure describes example optical components for an optical receiver to increase reliability and efficiency of optical coupling while maintaining small package sizes.

Specifically, this disclosure describes small-diameter, small-aperture, shallow profile (or planarized) lenses and concave mirrors designed to pass the chief ray at or near the center of the shallow-profile optical elements (e.g., shallow profile lenses and/or mirrors) and the PD. In some embodiments, the lens/mirror aperture is used to control back reflection from the PD.

Figure 1:
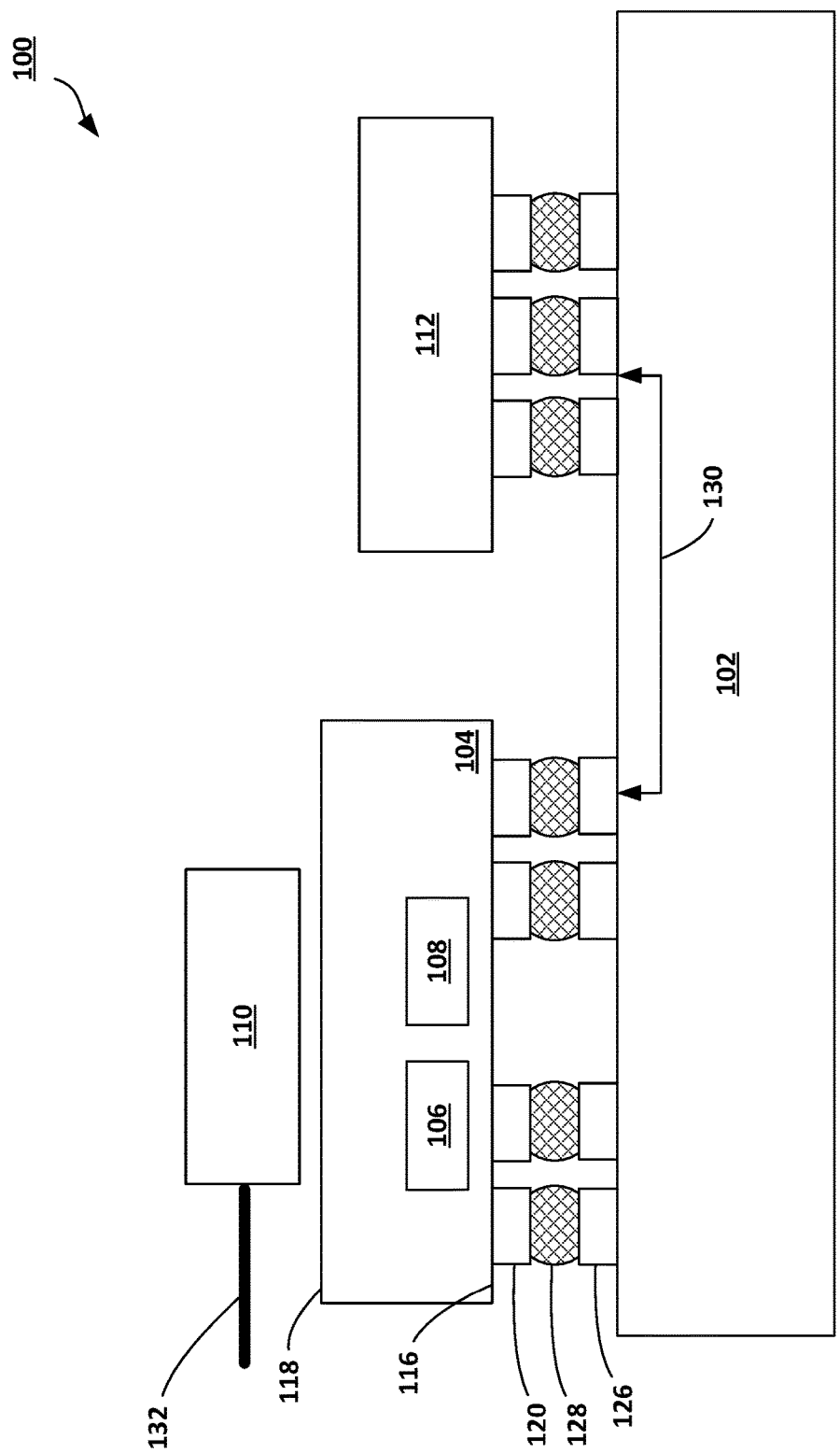
FIG. 1 is a schematic illustration of an optical receiver package with a backside lens-integrated PD die, according to some embodiments of the present disclosure.

FIG. 1 is a schematic illustration of an optical receiver package 100 with a backside lens-integrated PD die, according to some embodiments of the present disclosure.

As shown, the optical receiver package 100 may include a support structure 102, which may be referred to as a "PD support structure" because may be used to provide mechanical, and, optionally, also electrical, support for a PD die 104. In various embodiments, the PD support structure 102 may be any one of a substrate (e.g., a package substrate as described with reference to FIG. 7), an interposer (e.g., an interposer as described with reference to FIG. 7 or 8), or a circuit board (e.g., a circuit board as described with reference to FIG. 8).

As also shown in FIG. 1, the PD die 104 may include a PD 106 and a optical element 108. Optical element 108 can be a lens or a mirror or both, depending on the implementation choice. The position of the optical element 108 can be selected also based on the implementation choice. The PD position can also be selected based on the implementation choice. FIGS. 2A-C, 4A-E, and 5A-D provide example component configurations.

The PD die 104 may include a first face 116 and an opposing second face 118. The PD 106 may be proximate to or provided on the first face 116, in case the PD die 104 is attached to the support structure 102 in a flip-chip configuration, as illustrated in FIG. 1. FIG. 1 illustrates only one PD 106 in order to not clutter the drawing, but, in various embodiments of the assembly 100, any number of one or more PDs 106 may be implemented on the PD die 104. In various embodiments, the PD 106 may include any suitable means, e.g., a photodiode or phototransistor, for detecting light incident thereon and for generating electrical signals indicative of the detected light.

The PD die 104 may include a substrate that may include any material that may serve as a foundation for the PD 106. In some embodiments, the substrate of the PD die 104 may be a semiconductor substrate composed of semiconductor material systems including, for example, N-type or P-type materials systems. The substrate of the PD die 104 may include, for example, a crystalline substrate formed using a bulk silicon (or other bulk semiconductor material) or a SOI structure (or, in general, a semiconductor-on-insulator structure). In some embodiments, the substrate of the PD die 104 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the substrate of the PD die 104 may be non-crystalline. In some embodiments, the substrate of the PD die 104 may be a printed circuit board (PCB). In some embodiments, the substrate of the PD die 104 may be inhomogeneous, e.g., including a carrier material (such as glass or silicon carbide) with a thin semiconductor layer at the second or upper face 118. Although a few examples of the substrate of the PD die 104 are described here, any material or structure that may serve as a foundation upon which the PD 106 may be built falls within the spirit and scope of the present disclosure. The substrate of the PD die 104 may be part of a singulated die or a wafer.

The PD 106 is a device that can convert light incident thereon to electrical signals. PD 106 can be a semiconductor device. Photons are incident on the surface of the PD 106 can create an electron-hole pair, resulting in current flow. A PD 106 can be a p-n junction or other type of semiconductor device that uses light to cause current to flow.

Light may be provided to the PD 106 from an optical input device 110 that is coupled to a fiber optic cable 132. The fiber optic cable 132 can be connected at the other end to a fiber optic communications transmitter that transmits light signals across a fiber optic network. The light carried by the fiber optic cable 132 can be emitted from an endpoint of the fiber optic cable into an optical input device 110. The optical input device 110 can include optical materials and optical components to direct the light towards the PD die 104 (and more specifically, towards an optical element 108 on the PD die 104).

In general, the light provided to the PD 106 from the optical input device 110 may include any electromagnetic signals having information encoded therein (or, phrased differently, any electromagnetic signals modulated to include information). Often times, the electromagnetic signals are signals associated with optical amplitudes, phases, and wavelengths and, therefore, descriptions provided herein refer to "optical" signals (or light) and "optical" components (e.g., "optical input device 110"). However, the optical receiver packages 100 with PD dies with integrated backside lenses, as described herein, are not limited to operating with electromagnetic signals of optical spectrum and descriptions provided herein with reference to optical signals and/or optical components are equally applicable to electromagnetic signals of any suitable wavelength, such as electromagnetic signals in near-infrared (NIR) and/or infrared (IR) bands, as well as electromagnetic signals in the radio frequency (RF) and/or microwave bands.

In some embodiments, the light may be provided to, or guided by the optical input device 110 may be transmitted by a photonic IC (PIC), which may, e.g., include an electromagnetic source, a modulator, and an electromagnetic signal launcher. In some embodiments, an electromagnetic source of a PIC may include 1) an oscillator, if the PIC supports wavelengths on the millimeter scale, 2) a laser, if the PIC supports wavelengths between about 0.8 and 1.7 micrometer, or 3) some combination of an oscillator and a laser, if the PIC supports wavelengths between 0.8 micrometer and millimeters or centimeters. In some embodiments, a modulator of a PIC may be any device/component configured to encode information in/on to the electromagnetic signals. In some embodiments, an electromagnetic signal launcher of a PIC may include any component configured to feed, or launch, the electromagnetic signal into the medium of propagation. In some embodiments, an electromagnetic signal launcher may further be configured to perform a frequency or wavelength multiplexing function, e.g., frequency division multiplexing (FDM) or wavelength division multiplexing (WDM). Some examples of PICs include, but are not limited to, optical transmitter output waveguides and their associated sub-components. In other examples, the optical input device 110 itself may be considered to be a PIC because it transmits electromagnetic signals having information encoded therein. For example, the optical input device 110 may include, or be, an optical receiver input waveguide, e.g., a silicon photonic waveguide, e.g., those based on silicon-on-isolator (SOI) platform, configured to guide electromagnetic radiation of any wavelength bands from about 0.8 micrometer to about 5 centimeter. For example, the optical input device 110 supporting wavelengths from about 1.2 micrometer to about 1.7 micrometer (i.e., wavelengths in the NIR and/or IR bands) may be used for data communications and telecommunications. In another example, the optical input device 110 supporting wavelengths from about 1 millimeter to about 10 millimeter (i.e., wavelengths in the extremely high frequency (EHF) band of radio/micro-waves), in particular, wavelengths of about 2 millimeter, may be used for radar and RF wireless communications.

FIG. 1 further illustrates that, in some embodiments, the optical receiver package 100 may further include one or more electronic components 112 (only one of which is shown in FIG. 1), electrically coupled to the PD die 104, and configured to provide any suitable processing of the electrical signals generated by the PD 106.

As shown in FIG. 1, a plurality of conductive contacts 120 may be disposed at the first face 116 of the PD die 104. Conductive pathways (not specifically shown in FIG. 1) may extend and be coupled between the conductive contacts 120 and the various ICs implemented in the PD die 104, e.g., the PD 106, where, in various embodiments, such conductive pathways may be implemented as conductive vias, conductive lines, and/or any combination of conductive vias and lines. In various embodiments, the conductive contacts 120 may be formed of any suitable conductive material. The conductive contacts 120 may take form of, e.g., solder bond pads, conductive epoxies, anisotropic conductive films, copper to copper bonding posts, or any other first-level interconnect structures, to route electrical signals to/from the PD die 104, as discussed herein.

The support structure 102 may include a first face 122 and an opposing second face 124. Conductive contacts 126 may be disposed at the second face 124 of the support structure 102, as shown in FIG. 1. In some embodiments, similar conductive contacts may be disposed at the first face 122 (not specifically shown in FIG. 1). In such embodiments, conductive pathways (also not specifically shown in FIG. 1) may extend through an insulating material of the support structure 102 between the first face 122 and the second face 124 of the support structure 102, electrically coupling various ones of the conductive contacts 126 at the second face 124 to various ones of the conductive contacts at the first face 122, in any desired manner. In some embodiments, the insulating material of the support structure 102 may be a dielectric material, e.g., any of the suitable materials typically used as an interlayer dielectric (ILD). Examples of the insulating material of the support structure 102 may include, in some embodiments, silicon oxide, silicon nitride, aluminum oxide, and/or silicon oxynitride. The conductive pathways through the support structure 102 may include one or more conductive vias, one or more conductive lines, or a combination of conductive vias and conductive lines, for example.

In some embodiments, the support structure 102 may be or may otherwise include a silicon interposer, and the conductive pathways through the support structure 102 may be through-silicon vias. Silicon may have a desirably low coefficient of thermal expansion compared with other dielectric materials that may be used, and thus may limit the degree to which the support structure 102 expands and contracts during temperature changes relative to such other materials (e.g., polymers having higher coefficients of thermal expansion). A silicon interposer may also help the support structure 102 achieve a desirably small line width and maintain high connection density to the PD die 104.

In some embodiments, the support structure 102 may be a substrate, e.g., any one of the substrates described above with reference to the PD die 104.

As shown in FIG. 1, the conductive contacts 120 of the PD die 104 may be electrically coupled to the conductive contacts 126 of the support structure 102 via first-level interconnects 128. In some embodiments, the first-level interconnects 128 may include solder bumps or balls (as illustrated in FIG. 1). For example, the first-level interconnects 128 may be flip-chip, or C4, bumps disposed initially on the PD die 104 or on the support structure 102. In some embodiments, the PD die 104 may be brought in contact with the support structure 102 using a pick-and-place apparatus, for example, and a reflow or thermal compression bonding operation may be used to couple the PD die 104 to the support structure 102 via the first-level interconnects 128.

Second-level interconnects (e.g., solder balls or other types of interconnects; not specifically shown in FIG. 1) may be present on the first face 122 of the support structure 102, to couple the support structure 102 to another component, such as a circuit board (not specifically shown in FIG. 1).

Having first-level interconnects 128 disposed between the first face 116 of the PD die 104 and the second face 124 of the support structure 102 (e.g., using solder bumps as part of flip-chip packaging techniques) may enable the optical receiver package 100 to achieve a smaller footprint and higher die-to-package-substrate connection density than could be achieved using conventional wirebond techniques (in which conductive contacts between the PD die 104 and the support structure 102 are constrained to be located on the periphery of the PD die 104). For example, a PD die 104 having a square first face 116 with side length N may be able to form 4N wirebond interconnects to the support structure 102, versus $N^2$ flip-chip interconnects (utilizing the entire "full field" surface area of the first face 116). Additionally, in some applications, wirebond interconnects may generate unacceptable amounts of heat that may damage or otherwise interfere with the performance of the PD 106. Using the first-level interconnects 128 may enable the optical receiver package 100 to have much lower parasitic inductance relative to using wirebonds to couple the PD die 104 and the support structure 102, which may result in an improvement in signal integrity for high-speed signals that may be communicated between the PD die 104 and the support structure 102.

Various conductive contacts used in the optical receiver package 100, e.g., the conductive contacts 120 and/or 126, may include multiple layers of material that may be selected to serve different purposes. In some embodiments, the conductive contacts used in the optical receiver package 100 may be formed of aluminum, and may include a layer of gold (e.g., with a thickness of less than 1 micron) between the aluminum and the adjacent interconnect to limit the oxidation of the surface of the contacts and improve the adhesion with adjacent solder. Alternate materials for the surface finish include palladium, platinum, silver, and tin. In some embodiments, the conductive contacts used in the optical receiver package 100 may be formed of aluminum, and may include a layer of a barrier metal such as nickel, as well as a layer of gold, or other appropriate material, wherein the layer of barrier metal is disposed between the aluminum and the layer of gold, and the layer of gold is disposed between the barrier metal and the adjacent interconnect. In such embodiments, the gold, or other surface finish, may protect the barrier metal surface from oxidation before assembly, and the barrier metal may limit the diffusion of solder from the adjacent interconnects into the aluminum.

In some embodiments, the surface of the PD die 104 around the contacts 120 may be coated with a material which is not wetted by, e.g., the solder material of the first-level interconnects 128. This material is generally known as a solder mask and can take any appropriate form, such as silicon nitride, aluminum oxide, and silicon oxide. The presence of this solder mask material enables solder mask defined contacts.

In some embodiments, a solder resist material (not specifically shown in FIG. 1) may be disposed around the conductive contacts 126. The solder resist material may be a polyimide or similar material, or may be any appropriate type of packaging solder resist material. In some embodiments, the solder resist material may be a liquid or dry film material including photo-imageable polymers. In some embodiments, the solder resist material may be non-photo-imageable.

In various embodiments, more or fewer elements described above may be included in the support structure 102 and the PD die 104, compared to what is shown in FIG. 1. In some embodiments, conductive lines of the PD die 104 and the support structure 102 may extend into and out of the plane of the drawing, providing conductive pathways to route electrical signals to and/or from various elements in the PD die 104.

The conductive vias and/or lines that provide the conductive pathways in/on the PD die 104 or/and in/on the support structure 102 may be formed using any suitable techniques. Examples of such techniques may include subtractive fabrication techniques, additive or semi-additive fabrication techniques, single Damascene fabrication techniques, dual Damascene fabrication techniques, or any other suitable techniques. In some embodiments, layers of insulator material, such as e.g. oxide material or nitride material, may insulate various structures in the conductive pathways from proximate structures, and/or may serve as etch stops during fabrication. In some embodiments, additional layers, such as e.g. diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

As noted above, interconnect structures may be arranged within the PD die 104 and in the support structure 102 to route electrical signals according to a wide variety of designs. During operation of the PD 106, electrical signals (such as e.g. power, input/output (I/O) signals, including various control signals for external and internal control of the PD 106) may be routed to and/or from the PD 106 of the PD die 104 through the interconnects provided by the conductive contacts and conductive pathways of the PD die 104 and the support structure 102.

FIG. 1 illustrates one example conductive pathway within the support structure 102, shown as a conductive pathway 130, intended to provide an example of electrical coupling between the PD die 104 and a further electronic component 112 which may be implemented on a die that is separate from the PD die 104, but be coupled to the same support structure 102. In various embodiments, the electronic component 112 may be, or include, one or more voltage converters, trans-impedance amplifiers (TIA), clock and data recovery (CDR) components, microcontrollers, etc.

This disclosure describes receiver (RX) fiber block designs. The various designs described herein makes use of shallow etching, which both reduces the chamber time (and cost) and improves the surface quality. Shallow etching also allows for small physical aperture which in turn allows to reduce the pitch of the lens array reducing the footprint and reduced sensitivity to post-cure angular shifts. Multi-path solutions are also described, which use concave mirrors reduce the sensitivity to post-cure shifts further, potentially allowing for passive alignment.

Advantages of the present disclosure are readily apparent to those of skill in the art. Among the advantages are low component sag (especially the mirror designs) which could be achieved with Resist Reflow method using thin photoresist. Passing the chief ray close to the center of the lens makes for extremely robust designs insensitive to the Conic constant variations. Zero nominal Conic demonstrate that even simple spherical lens designs (constant etching rate/prescription during the etch) in the Resist Reflow process would result in a good performance.

Regardless of what process is used (greyscale lithography, resist reflow, etc.), shallow etch would allow low-selectivity methods resulting in better surface quality.

If CMP is used for further smoothing of the surface, shallow lenses/mirrors in the array would shadow each other less than larger sag counterparts resulting in lower Surface Profile Deviations increasing the yield.

Small sag would reduce the etch time reducing the cost of the device.

Small Physical Aperture lenses/mirrors allow for reduced-pitch arrays of lenses, which is beneficial as channel count increases.

Other advantages include:
Easy tape/residue removal from the back side (lens/mirror) of the wafer;
Easy handling of the wafer (vacuum holders);
Etching the lens and backside structures in any order;
Adding extra lithographic features after the lens was formed.

Figure 2B:
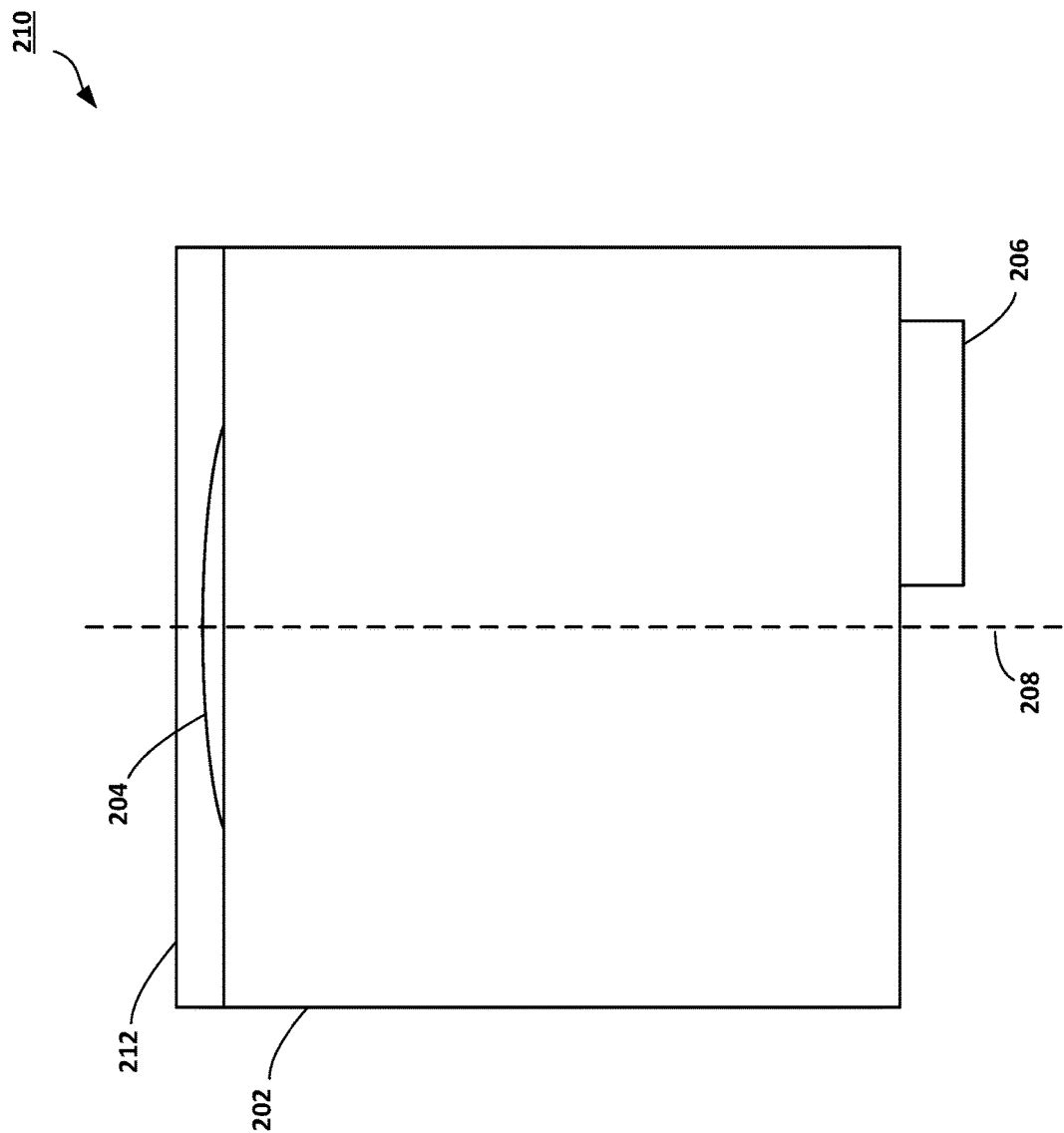
Figure 2C:
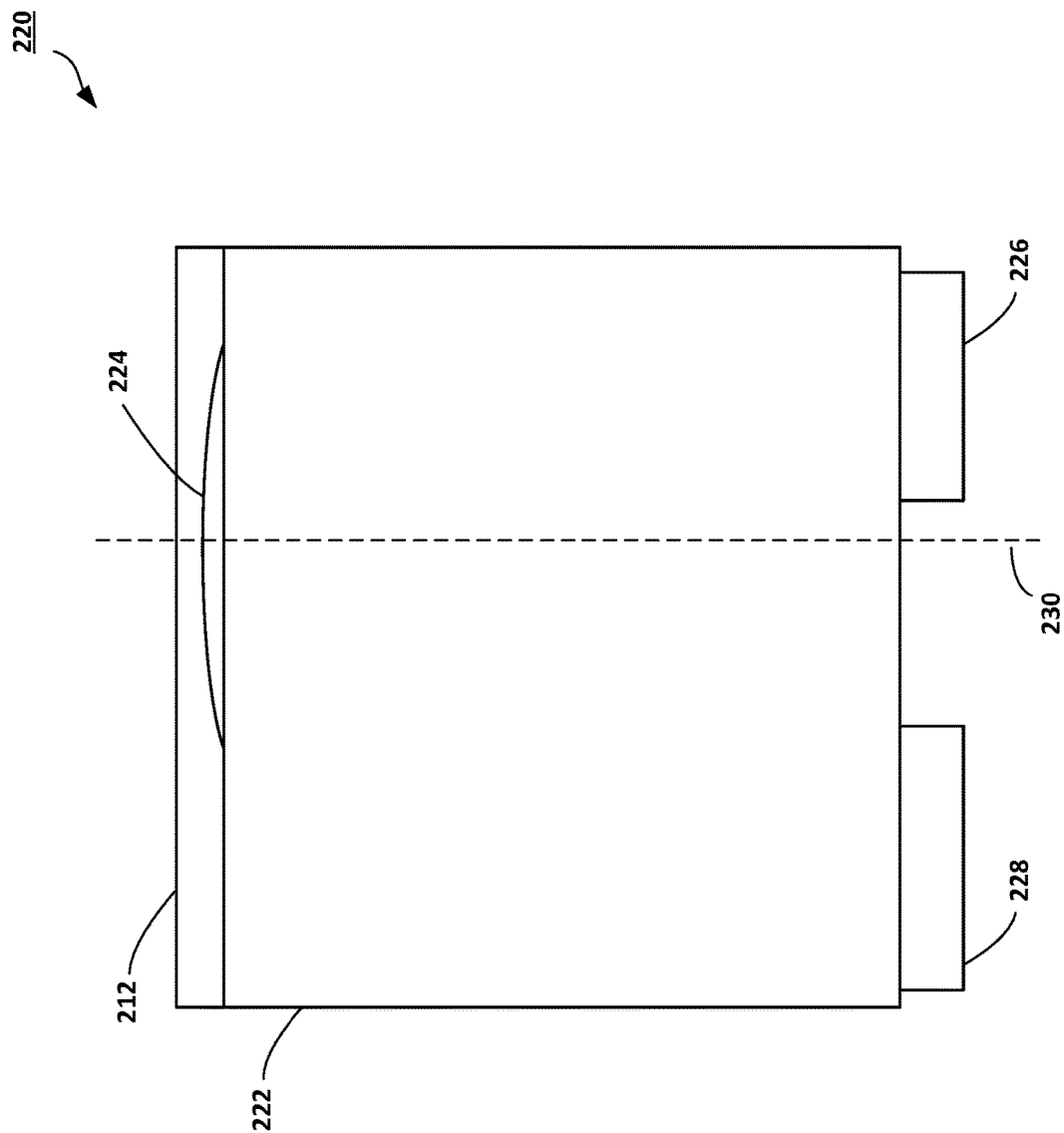

FIGS. 2A-C are schematic block diagrams of example optical assemblies that include shallow profile optical elements in accordance with embodiments of the present disclosure. The optical designs are configured to send the chief ray of the incoming beam as close to the center of the lens as possible, but at an angle to the optical axis of the lens. This design choice places the photodetector location off-axis with respect to the lens. FIG. 2A is a schematic block diagram 200 of an example PD die 202 that includes a lens 204 and a photodetector 206. The PD die 202 can be silicon, and in some embodiments, have a germanium surface. The lens 204 can be a spherical lens or other type of lens. The lens 204 can be etched in the silicon using an analog lithography process that uses a greyscale photoresist exposure, resist reflow techniques, etc. The lens 204 can be shallow and etched to reduce sag. For example, lens 204 can have a radius of curvature of about 300 microns, but can be more or less than 300 microns, depending on implementation choices and other parameters. In addition, the ratio of the sag to clear aperture of the lens can be less than or equal to 1:10. This is in part due to the size of the aperture.

The PD die 202 can include a substrate. The substrate of the PD die 202 may include, for example, a crystalline substrate formed using a bulk silicon (or other bulk semiconductor material) or a SOI structure (or, in general, a semiconductor-on-insulator structure). In some embodiments, the substrate of the PD die 202 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the substrate of the PD die 202 may be non-crystalline. In some embodiments, the substrate of the PD die 202 may be a printed circuit board (PCB). In some embodiments, the substrate of the PD die 202 may be inhomogeneous, e.g., including a carrier material (such as glass or silicon carbide) with a thin semiconductor layer at the second or upper face. Although a few examples of the substrate of the PD die 202 are described here, any material or structure that may serve as a foundation upon which the PD 206 may be built falls within the spirit and scope of the present disclosure. The substrate of the PD die 202 may be part of a singulated die or a wafer.

The position of the PD 206 is offset from the optical axis 208 of the lens 204. The PD 206 can be a small size by controlling the angle the incident light transmits through the lens 204 and the lens parameters and the optical path between the output of the waveguide and the PD 206. The PD 206 is meant to be as small as possible. In some embodiments, the PD 206 can be 13 microns or slightly larger or slightly smaller than 13 microns. Other sized PDs are contemplated.

The small aperture size, and resulting low sag (e.g., less than 10 microns) allows for lens re-planarization of the wafer back side. For example, FIG. 2B is a schematic diagram 210 illustrating a PD die 202 that includes a planarization layer 212. The planarization layer 212 can be formed by deposition and planarization of a dielectric layer (for example, a thick ~10-12 micron (μm) PECVD oxide followed by chemical-mechanical planarization (CMP), silicon dioxide, silicon nitride, etc.). Other materials such as spin-on glass or polymers can also be utilized, as can other fabrication methods (e.g. dielectric layer deposit, chemical vapor deposition, etching, etc).

FIG. 2C is a schematic diagram 220 of another embodiment where mirrors are used. The PD die 222 can use a concave mirror 224, instead of a lens, which reduces the sag even further. The light can traverse through the optional planarization layer 212 and PD die 222 reflect off of a flat mirror 228. The light reflects off flat mirror 228 at an angle, directing the light towards concave mirror 224, and towards PD 226. PD 226 is offset relative the concave mirror optical axis 230.

Figure 3:
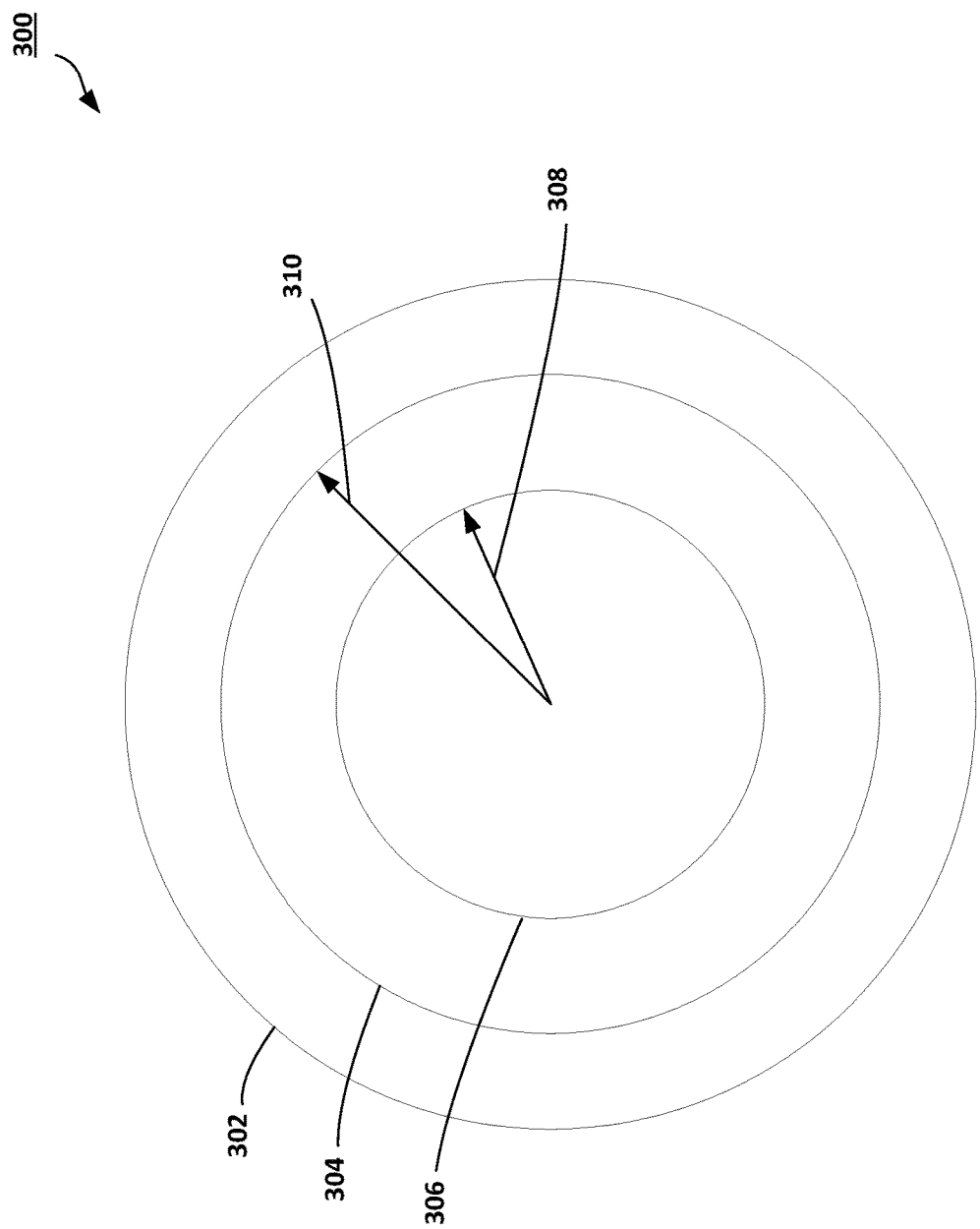
FIG. 3 is a schematic diagram of an example clear aperture and spot size in accordance with embodiments of the present disclosure.

FIG. 3 is a schematic diagram 300 of an example clear aperture and spot size in accordance with embodiments of the present disclosure. The shallow lens 302 can have a total area and a clear aperture 304. The clear aperture 304 is an area of the lens less than the total area. A clear aperture of a lens is an area of the lens that satisfies predetermined specifications. The shallow lens 302 can be designed such that the clear aperture 304 is as small as possible. For example, the clear aperture 304 can be about 40% larger than the laser spot size 306 at 1/e^2 at the lens surface). In FIG. 3, the radius 308 represents the radius of the laser spot size 306, while the radius 310 represents the radius of the clear aperture 304. While not drawn to scale, the respective radii illustrate the size of the clear aperture 304 relative to the laser spot size 306. As mentioned previously, a small aperture also results in greatly reduced lens sag (<10 um), which allows for re-planarization of the wafer back side by deposition and planarization of a dielectric layer. The smallness of the lens aperture can also prevent beam truncation at the entrance of the PD die.

In some embodiments, lens planarization could require deposition of two antireflective (AR) coatings: air-to-planarizing material (say Silicon oxide), and planarizing layer-to-silicon, which can increase the cost of the chip. Shallow lenses without planarization would use a single AR coating (plus metallization of the mirrors if the latter are used, though dielectric reflective coatings may also be used).

Figure 4A:
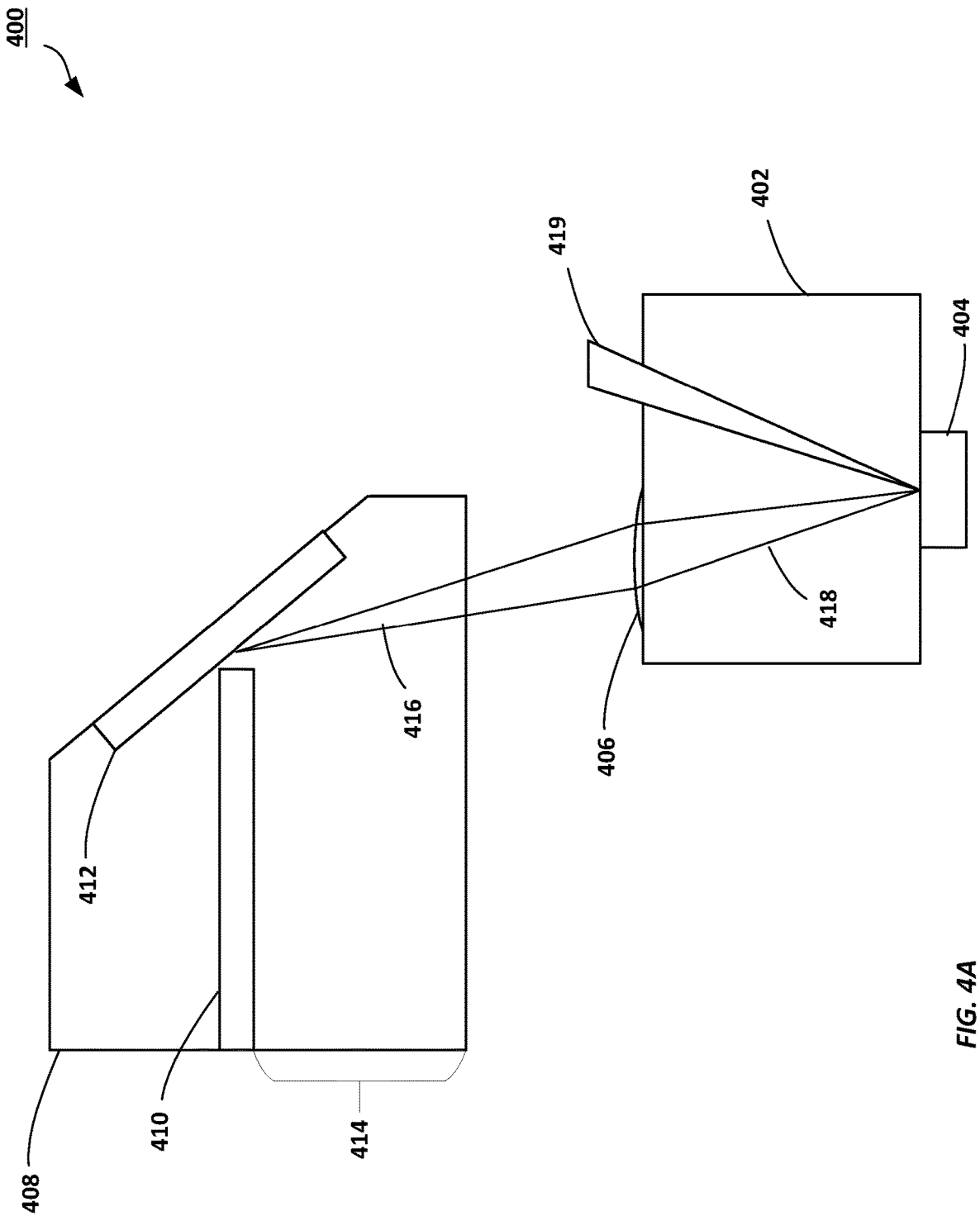

FIGS. 4A-D are schematic diagrams of an example optical receiver assembly in accordance with embodiments of the present disclosure. FIGS. 4A-D illustrates various example embodiments and configurations for optical receiver components that use shallow lenses. FIG. 4A is a schematic diagram of an example optical assembly 400 that includes a PD die 402 and an optical receiver 408. The PD die 402 can include a PD 404 and a lens 406, in a similar configuration as those shown in FIGS. 2A-C. The optical receiver 408 can include a waveguide 410 that carries an incoming optical signal to the optical receiver. The waveguide 410 can include an optical fiber to propagate and emit light, which is reflected by a optical element 412 through the glass lid 414 towards the PD die 402. The waveguide 410 can make use of total internal reflection to cause the light signal to propagate through the waveguide. Optical element 412 can include a turning mirror that can provide total internal reflection. Optical element 412 can reflect light 416 through lid 414 and out of the optical receiver 408 towards the PD die 402. In embodiments, the optical receiver 408 does not include a lens or other optical to focus light transmitted from the optical receiver towards the PD die 402. The lens 406 performs the optical refraction, focusing, and other optical control of light towards the PD.

In embodiments, the optical receiver 408 can include a port to receive a fiber optic cable and to couple the output of the fiber optic cable to the waveguide.

The PD die 402 can include a shallow lens 406 that focuses the light towards the PD 404. The focused light 418 can be directed to the PD at an angle. FIG. 4A also illustrates back reflection 419, which can be minimized based on the size of the aperture. The smallness of the aperture is used to limit (or eliminate) the back reflection.

Figure 4B:
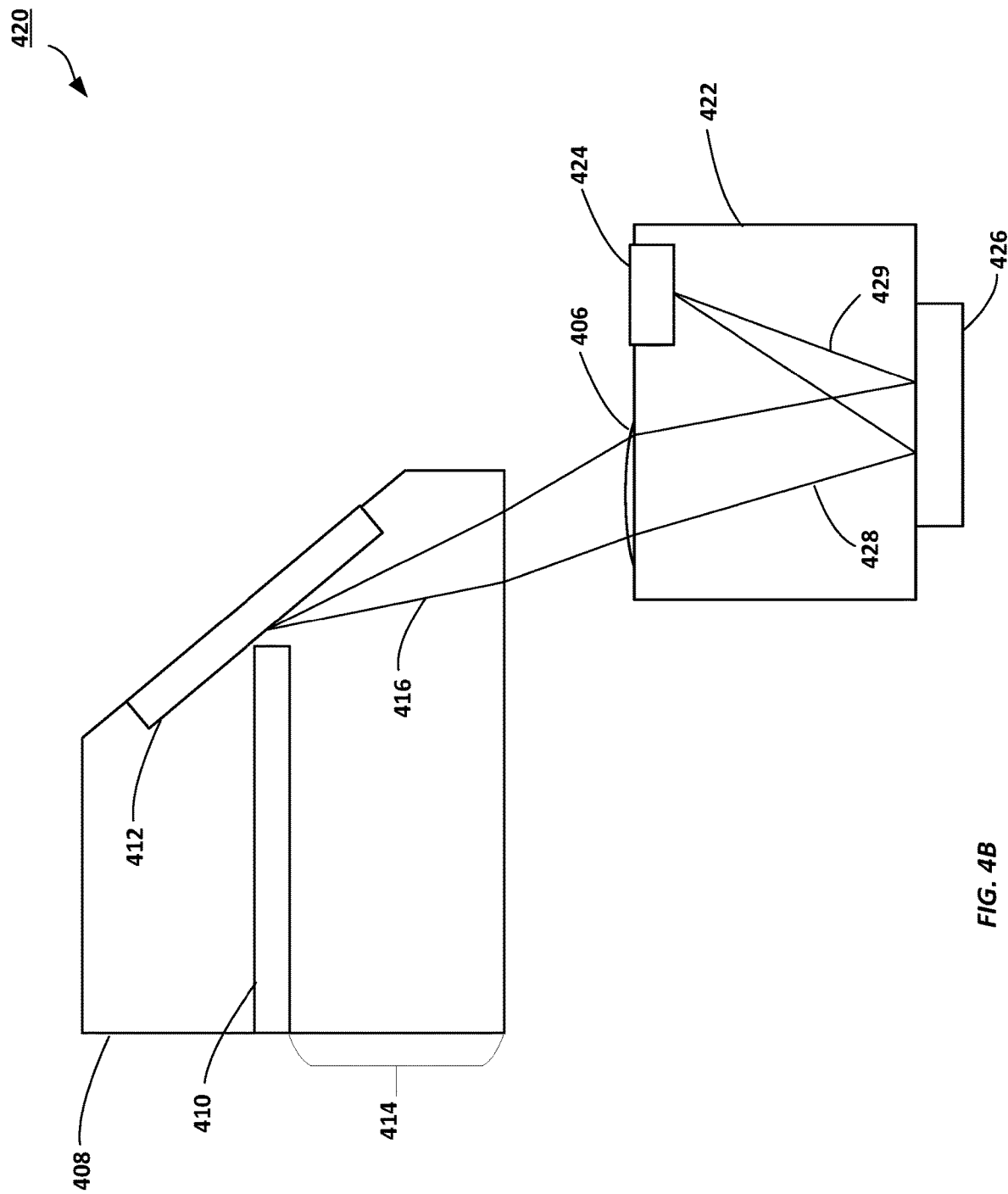

FIG. 4B is a schematic block diagram of another embodiment of an optical assembly 420 in accordance with embodiments of the present disclosure. Optical assembly 420 includes a PD die 422. PD die 422 includes a shallow lens 406 and a flat or folding mirror 426. In optical assembly 420, beam 416 emitted from the optical receiver 408 is refracted by shallow lens 406. The beam 428 may be allowed to diverge prior to hitting the surface of flat or folding mirror 426. The reflected light 429 can be directed to PD 424. By diverging the beam 428, the height of the assembly can be reduced.

Figure 4C:
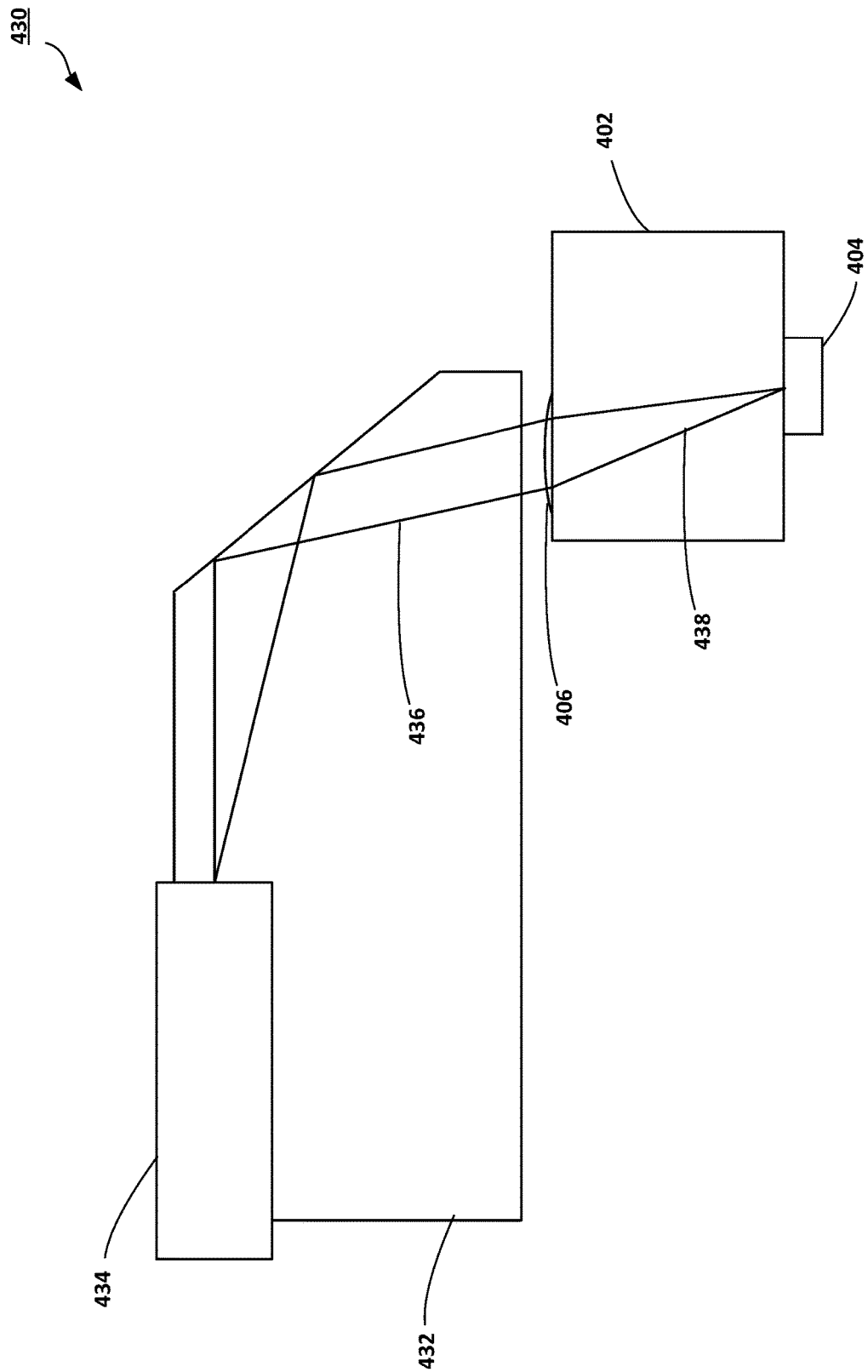
Figure 4D:
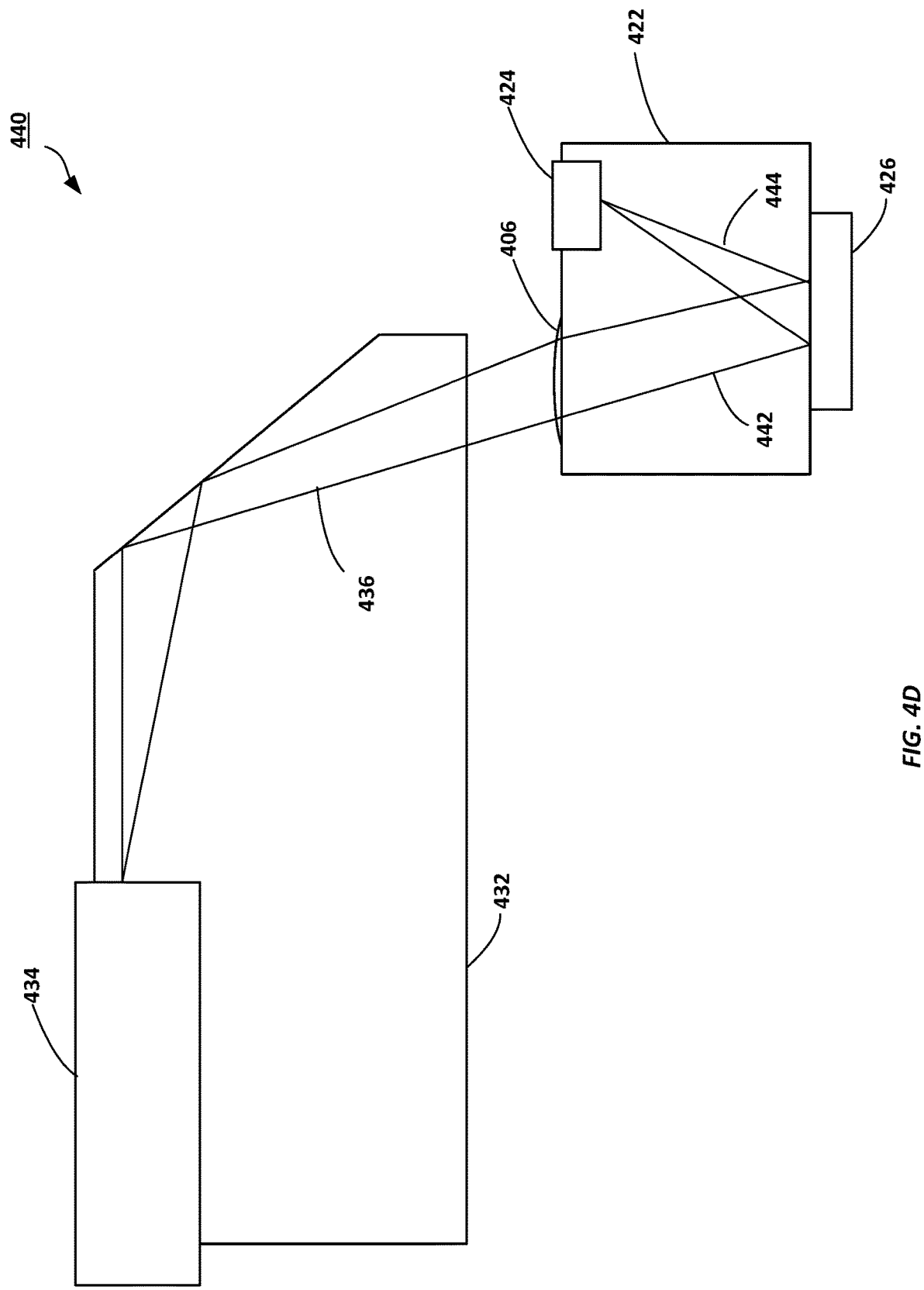

FIG. 4C is a schematic block diagram of another embodiment of an optical assembly 430 in accordance with embodiments of the present disclosure. In optical assembly 430, the optical receiver 432 can include a waveguide 434 in or supported by a groove, such as a V-groove. The waveguide 434 would emit light, which is reflected by an optical element in the receiving element 432. The light 436 is directed out of the optical receiver 432 towards the PD die 402 and lens 406 and transmitted through lens 406. The focused light 438 is captured by the PD 404. FIG. 4D is a schematic block diagram of another embodiment of an optical assembly 440 in accordance with embodiments of the present disclosure. Optical assembly 440 is similar to optical assembly 430, but uses the flat mirror 426 of optically assembly 420.

FIG. 4E is a schematic block diagram similar to that shown in FIG. 4A. In FIG. 4E, a light ray 450 is illustrated as being incident on lens 406 at an angle x relative to the vertical. Angle x can be selected based on implementation choices. The refracted light ray 542 is incident on the PD 404 at an angle y relative to the vertical. In embodiments, y is less than x. FIG. 4E also highlights that the PD 404 is offset from the optical axis of the lens 406.

Figure 5A:
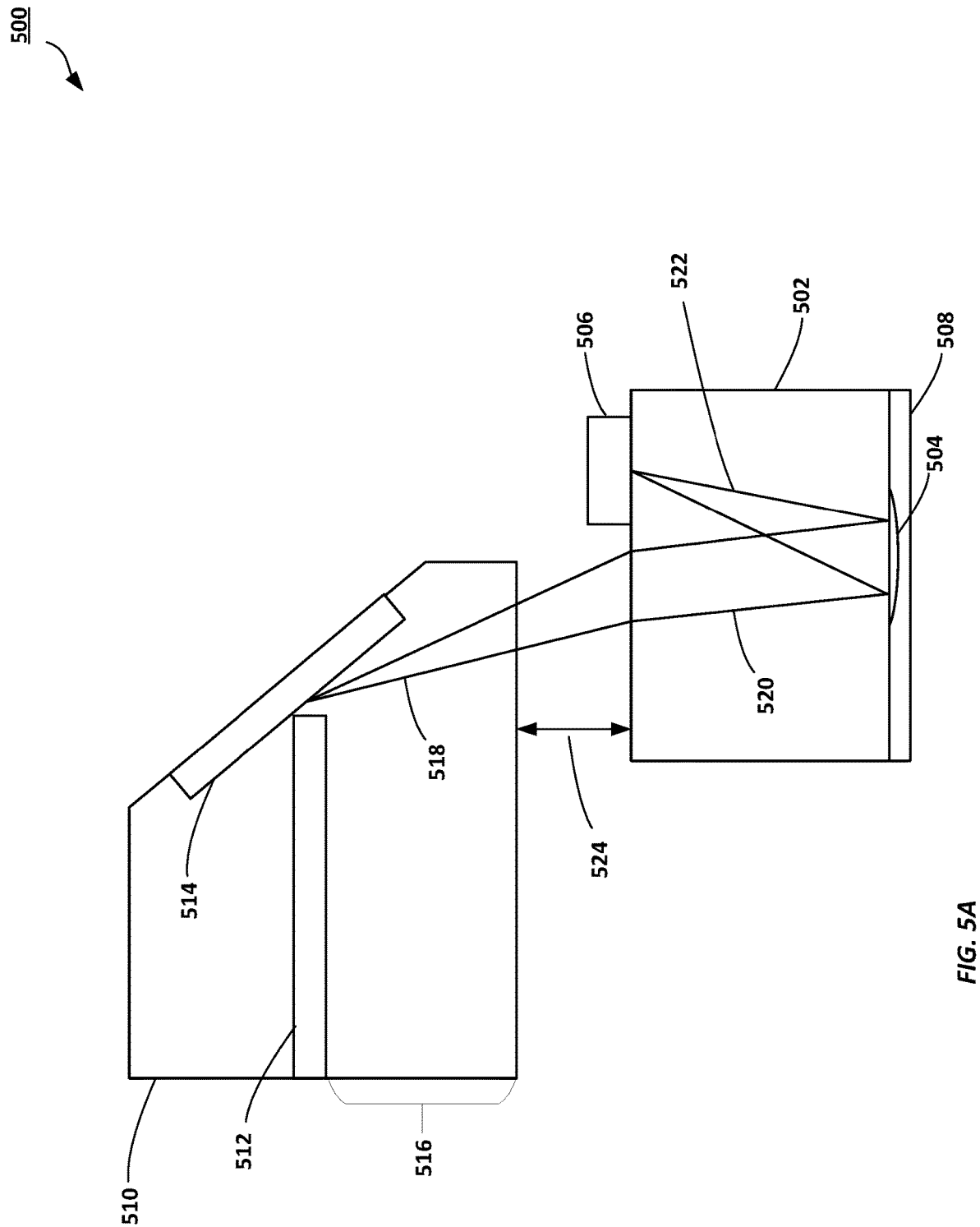
FIGS. 5A-D are schematic diagrams of an example optical receiver assembly in accordance with other embodiments of the present disclosure.
Figure 5B:
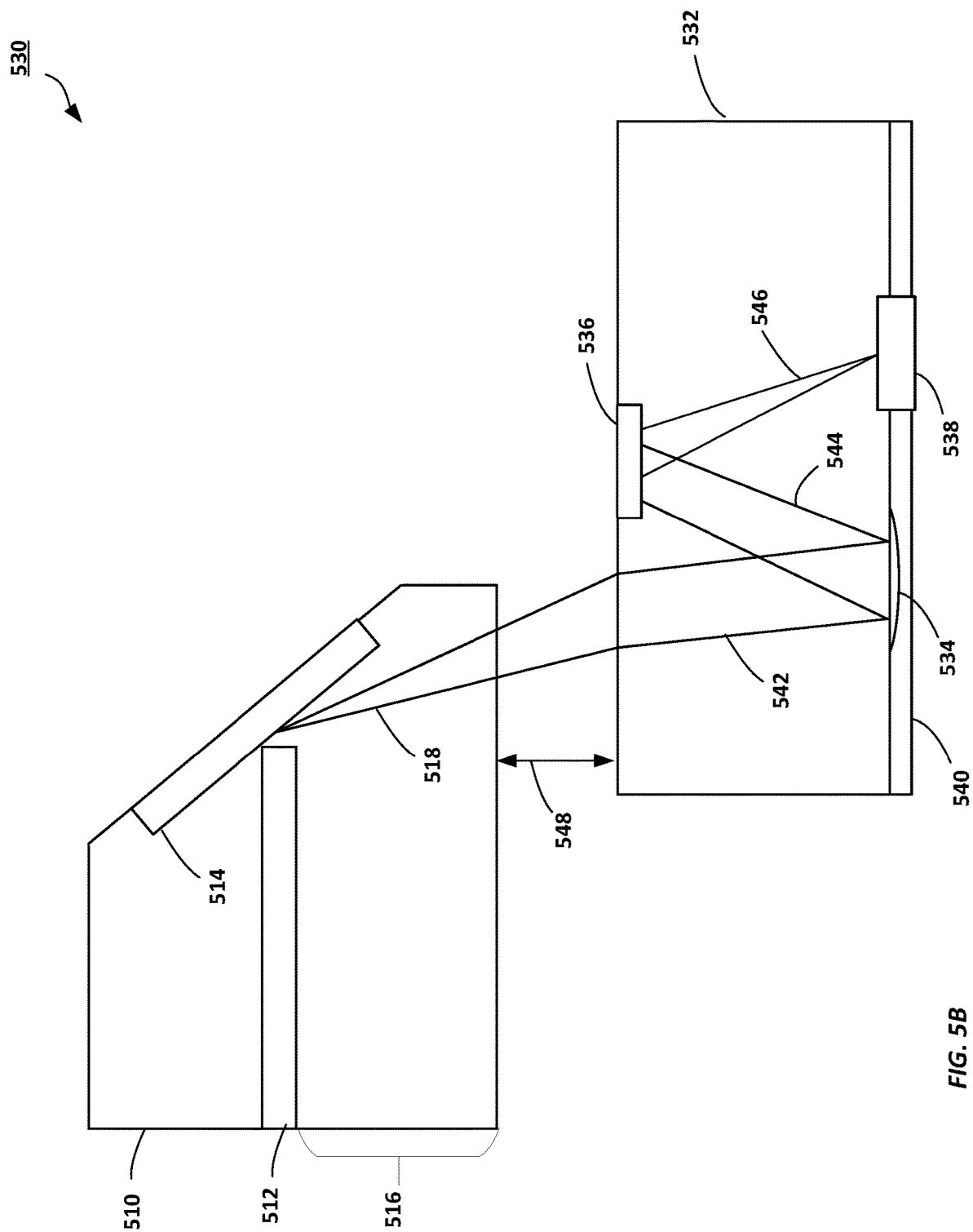
Figure 5C:
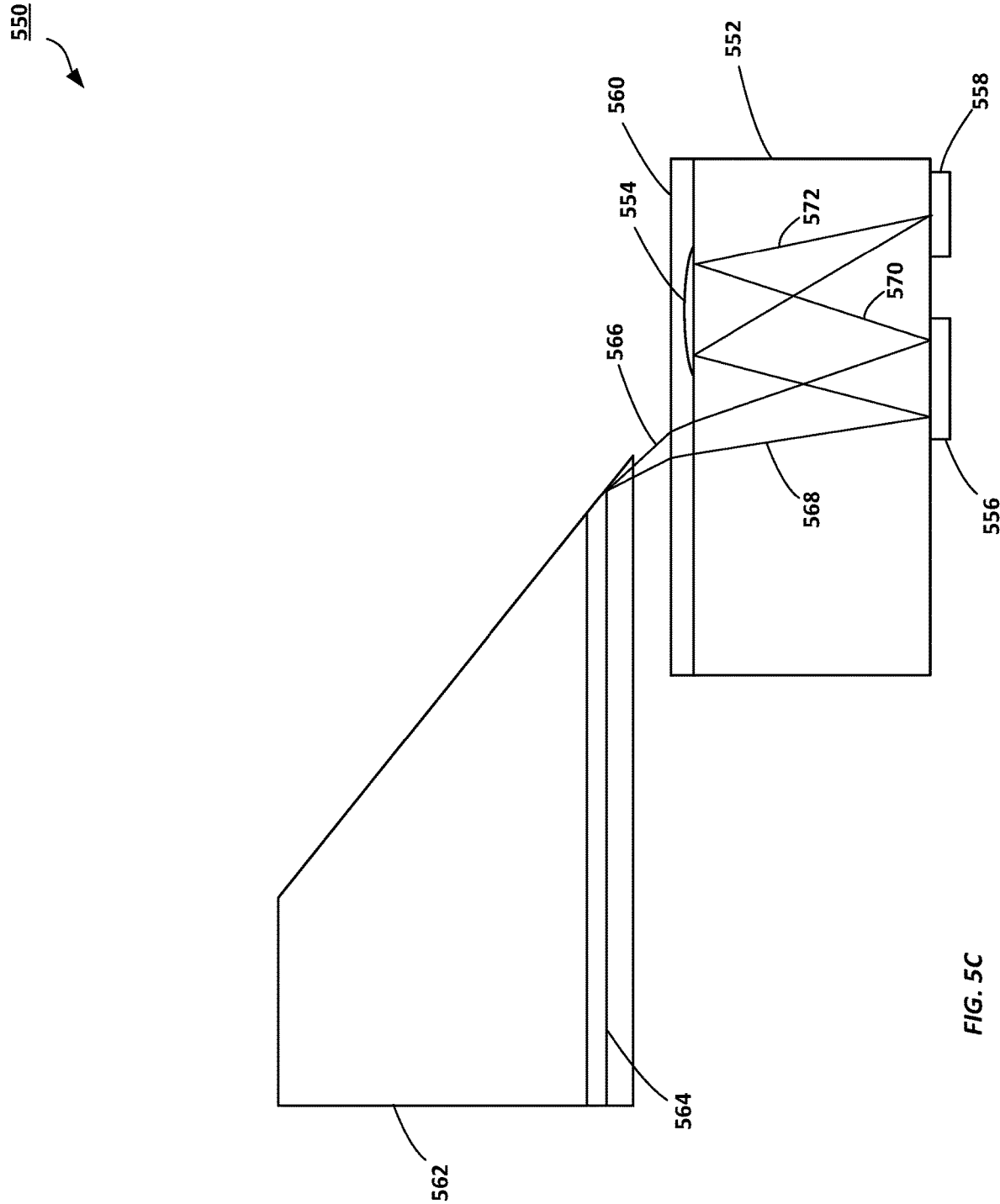

FIGS. 5A-C are schematic diagrams of an example optical receiver assembly in accordance with other embodiments of the present disclosure. In FIGS. 5A-C, a concave mirror is used instead of a shallow lens. The concave mirror can further reduce sag while maintaining low profiles and ease of manufacturing. FIG. 5A is a schematic block diagram of an example embodiment of an optical assembly 500 in accordance with embodiments of the present disclosure. The optical receiver 510 can be similar to optical receiver 408. The receiver assembly 510 can include a waveguide 512 that emits light towards an optical element 514. The light 518 reflected from optical element 514 transmits through glass lid 516 towards PD die 502.

PD die 502 can include a concave mirror 504. The concave mirror 504 can reflect light 520 towards a backside-illuminated PD 506 on top of the PD die 502. The reflected light 522 can be focused onto the PD 506 by the optics of the PD die 502. The airgap 524 can be reduced by increasing the optical path and thereby decreasing the system magnification. The PD die 502 can include optional planarization 508.

FIG. 5B is a schematic block diagram of another example embodiment of an optical receiver assembly 530 in accordance with embodiments of the present disclosure. Optical receiver assembly 530 can include a PD die 532 and an optical receiver 510. PD die 532 that includes a concave mirror 534 for directing light 542 towards a flat or folding mirror 536. The flat or folding mirror 536 can reflect light to PD 538. By using a flat or folding mirror 536, both the complex lithographic features (the mirror 534 and PD 538) are on the same side of the substrate or wafer. By having both lithographic features on the same side of the substrate, it can be easier to manipulate the substrate from the backside. Using only a minimal airgap 548 and reducing the thickness of glass lid 516. Potentially, such 2-fold structures can be made of transparent material such as glass or fused Silica and used with top-illuminated detectors using passive alignment. The PD die 532 can include optional planarization 540.

FIG. 5C is a schematic block diagram of another example optical receiver assembly 530 in accordance with embodiments of the present disclosure. The optical receiver 562 includes a waveguide 564 that can emit light from a tip of the receiver 562. The distance between the tip of the receiver 562 and the PD die 552 can be kept small. The light 566 can transmit through the PD die either directly or through an optional planarization layer 560. The light 568 can reflect off of a mirror 556 (flat mirror or folding mirror) to concave mirror 554. The reflected light 572 off of concave mirror 554 can be directed to PD 558. The PD die 552 can include optional planarization 560.

Figure 5D:
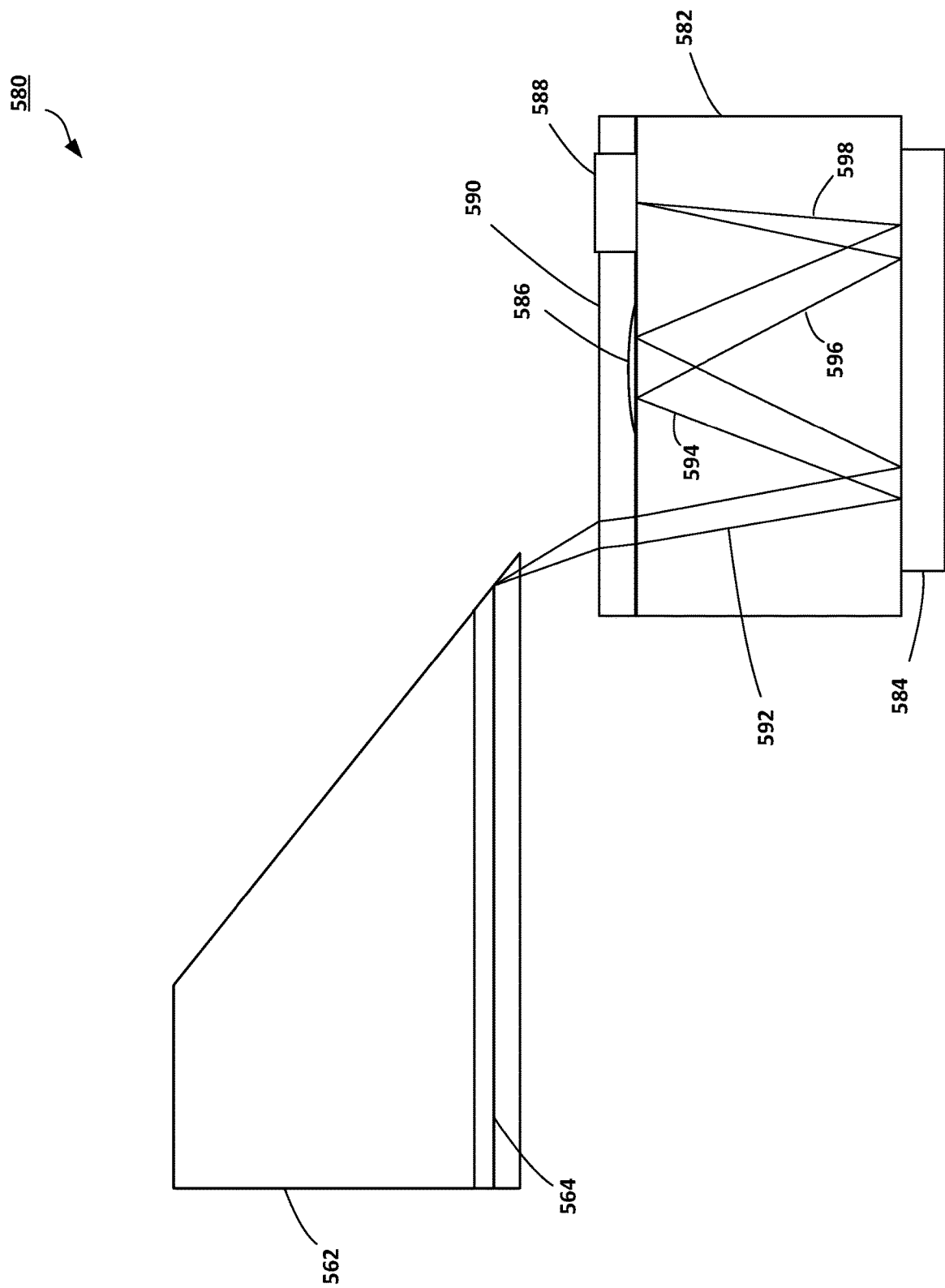

FIG. 5D is a schematic block diagram of another example optical receiver assembly 580 in accordance with embodiments of the present disclosure. Optical receiver assembly 580 includes a similar optical receiver 562 as described previously. The PD die 582 includes a larger flat mirror 584 that can reflect light multiple times. In this instance, the mirror 584 reflects light 592 as light 594 towards concave (shallow) mirror 586. Concave mirror 586 reflects light 594 as light 596 towards the flat mirror 584. Reflected light 598 is directed by the flat mirror 598 to PD 588. Other configurations are also possible to extend the optical path of the light within the PD die substrate prior to the light reaching the PD 588. This configuration (like the 5B) allows the mirror and the PD to be at the same side of the wafer.

Figure 6:
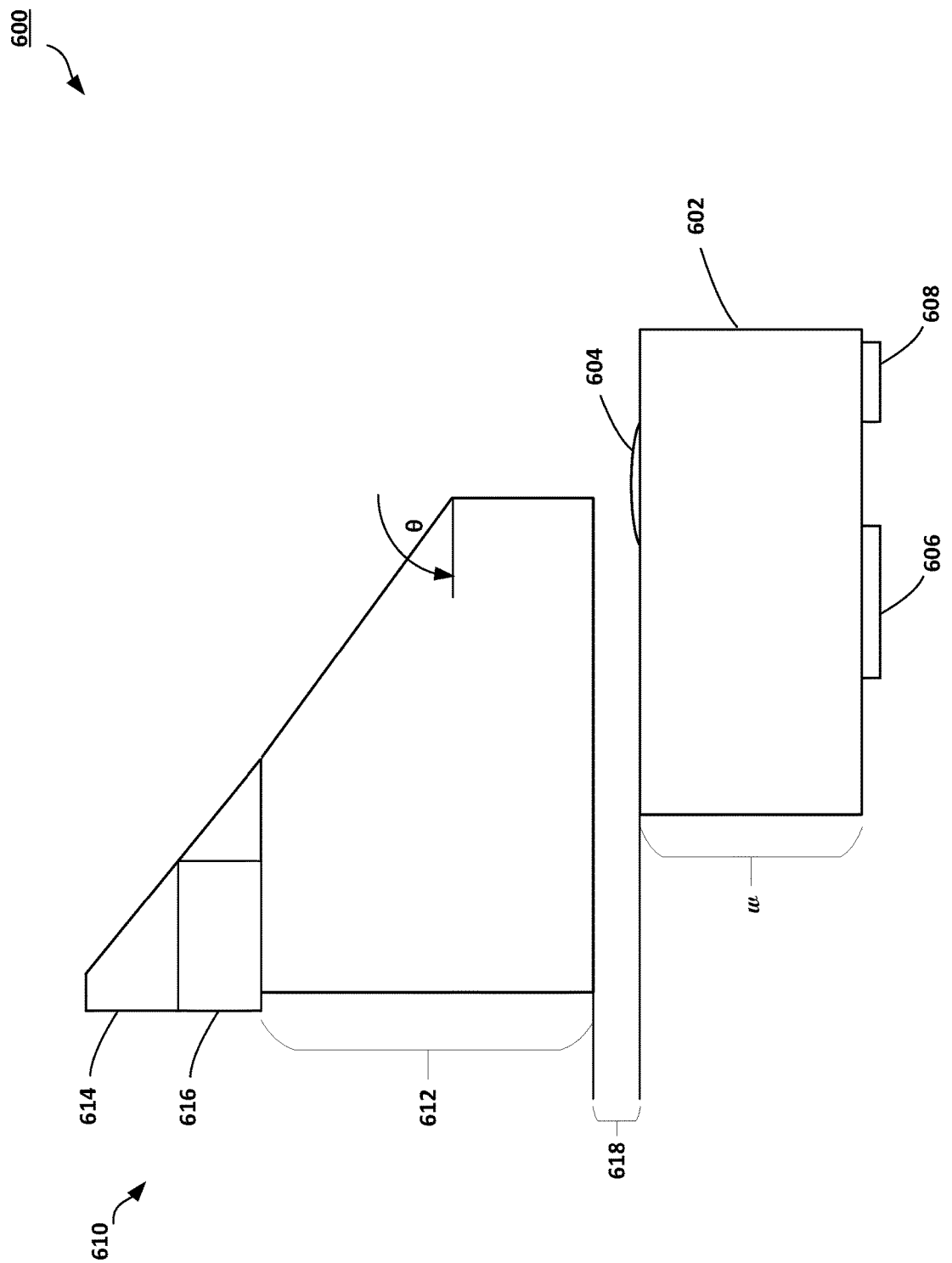
FIG. 6 is a schematic diagram of another example optical receiver assembly in accordance with embodiments of the present disclosure.

FIG. 6 is a schematic diagram of another example optical receiver assembly 600 in accordance with embodiments of the present disclosure. The optical receiver assembly 600 includes a PD die 602 that includes shallow mirror 604 (with an optional planarization layer, not shown) on a first side of the PD die 602. The PD die includes a mirror 606, which can be a flat mirror or folding mirror, on a second side opposite the first side of the PD die 602. A PD 608 can also reside on the second side of the PD die 602.

The optical receiver assembly 600 can also include an optical receiver 610. Optical receiver 610 is disposed proximate to the first side of the PD die 602. The optical receiver 610 can include a waveguide or optical fiber 616 that carries or propagates a light signal from an optical transmitter across a fiber optic network. The optical receiver 610 can include a receiver or mount structure 614 for the waveguide 616 to secure the waveguide 616 in place. The receiver or mount structure 614 can be a port or other type of receiving element to receive an optical fiber.

The optical receiver 610 can also include a lid 612. Lid 612 can be made of glass or can be made of other optical materials. The lid 612 can overlap with the mirror 606 (or lens if a lens is used).

By way of example, the lid 612 can have a height on one side of about 200 microns. The lid taper can have an angle θ from the horizontal of 37 degrees. The airgap 618 can be about 10 microns, which is larger than the mirror sag of 3.6 microns. The mirror can have a radius of curvature of about 590 microns and a clear aperture of about 150 microns. The width w of the PD die 602 can be about 500 microns.

These dimensions are meant to provide examples only and are not limiting.

Advantages of the present disclosure can include, but are not limited to:

Shallow-lens and shallow-mirror design (planarized or not) have very small sag (especially the mirror designs) which could be achieved with Resist Reflow method using thin photoresist.

Passing the chief ray close to the center of the lens makes for extremely robust designs insensitive to the Conic constant variations.

Zero nominal Conic was used in the simulations to show that even simplest spherical lens (constant etching rate/prescription during the etch) in Resist Reflow process would result in a good performance.

Regardless of what process is used (greyscale lithography or resist reflow), shallow etching would allow low-selectivity methods resulting in lower post-etch roughness and better surface quality of the optical elements.

If CMP is used for further smoothing of the surface, shallow lenses/mirrors in the array would shadow each other less than larger sag counterparts resulting in lower Surface Profile Deviations increasing the yield.

Small sag would reduce the etch time reducing the cost of the device.

Small Physical Aperture lenses/mirrors allow for reduced-pitch arrays of lenses, which is beneficial as channel count increases.

Loose (+/−20 um) tolerances to the source shift in some designs (multi-pass mirrors) allowing to mix the components of different CT (such as Ultem plastic and Silicon) and potentially even allow for passive alignment further reducing the cost.

Table 1 provides example simulation data for various embodiments of the present disclosure:

TABLE 1

Simulation Data for Various Embodiments

| | FIG. 4A | FIG. 5A (140 micron airgap) | FIG. 5B (10 micron airgap) | FIG. 5B (150 micron airgap) |
|---|---|---|---|---|
| Radius of Curvature μm | 297 | 695 | 702 | 780 |
| Conic | 0 | 0 | 0 | 0 |
| System Magnification | 0.59 | 0.47 | 0.46 | 0.32 |
| Clear/Physical Aperture μm | 120/150 | 120/150 | 120/150 | 140/175 |
| Sag, μm | 9.6 | 4 | 4 | 3.6 |
| Conic constant tolerance at 0.5 dB loss, +/− | 12 | >20 | >20 | >20 |
| Shift tolerance at 0.5 dB loss, μm | 8 | 11.5 | 11.5 | 18.5 |

Example Devices and Components

Figure 7:
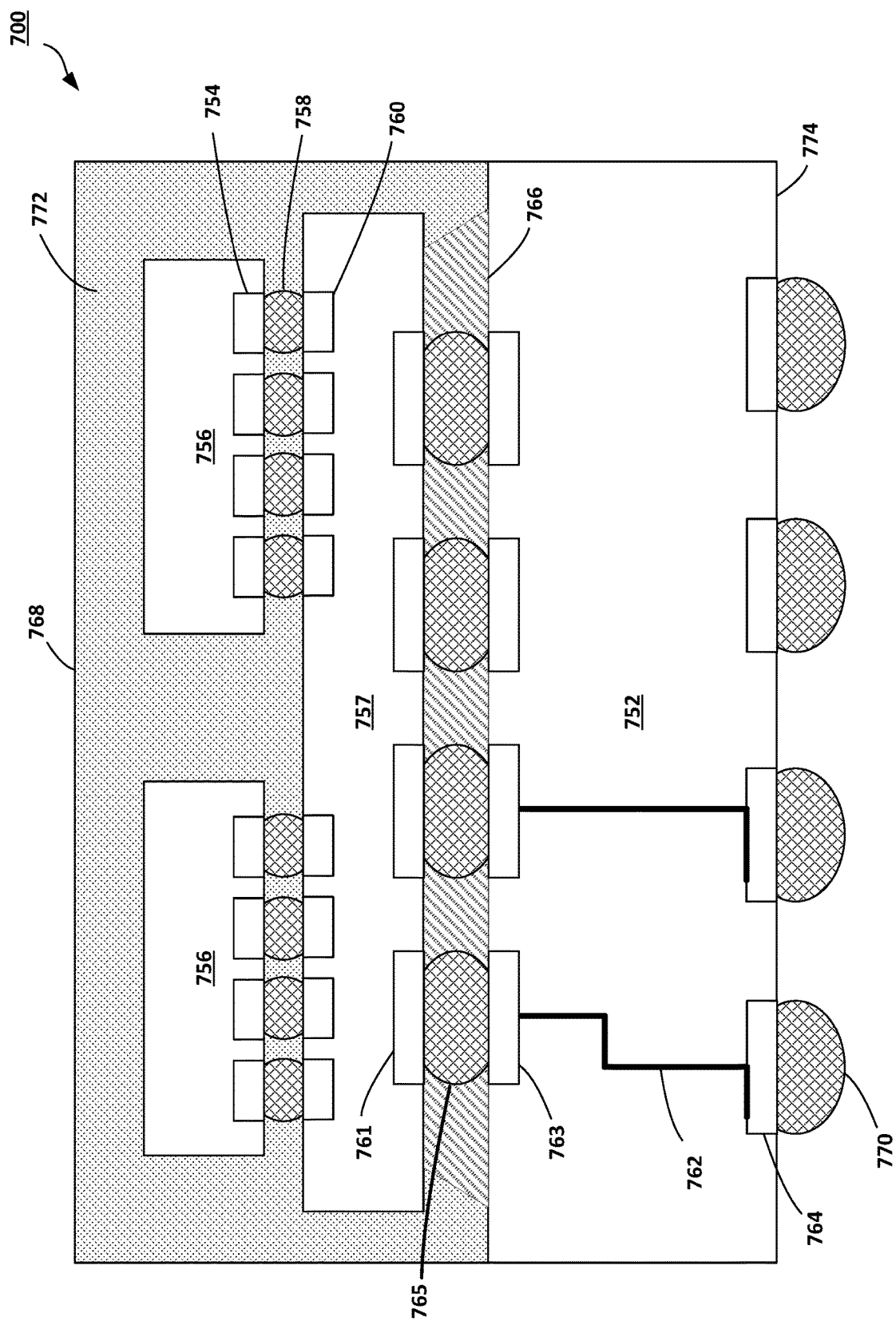
FIG. 7 is a cross-sectional side view of a device package that may include one or more optical receiver packages with backside lens-integrated PD dies in accordance with any of the embodiments disclosed herein.
Figure 8:
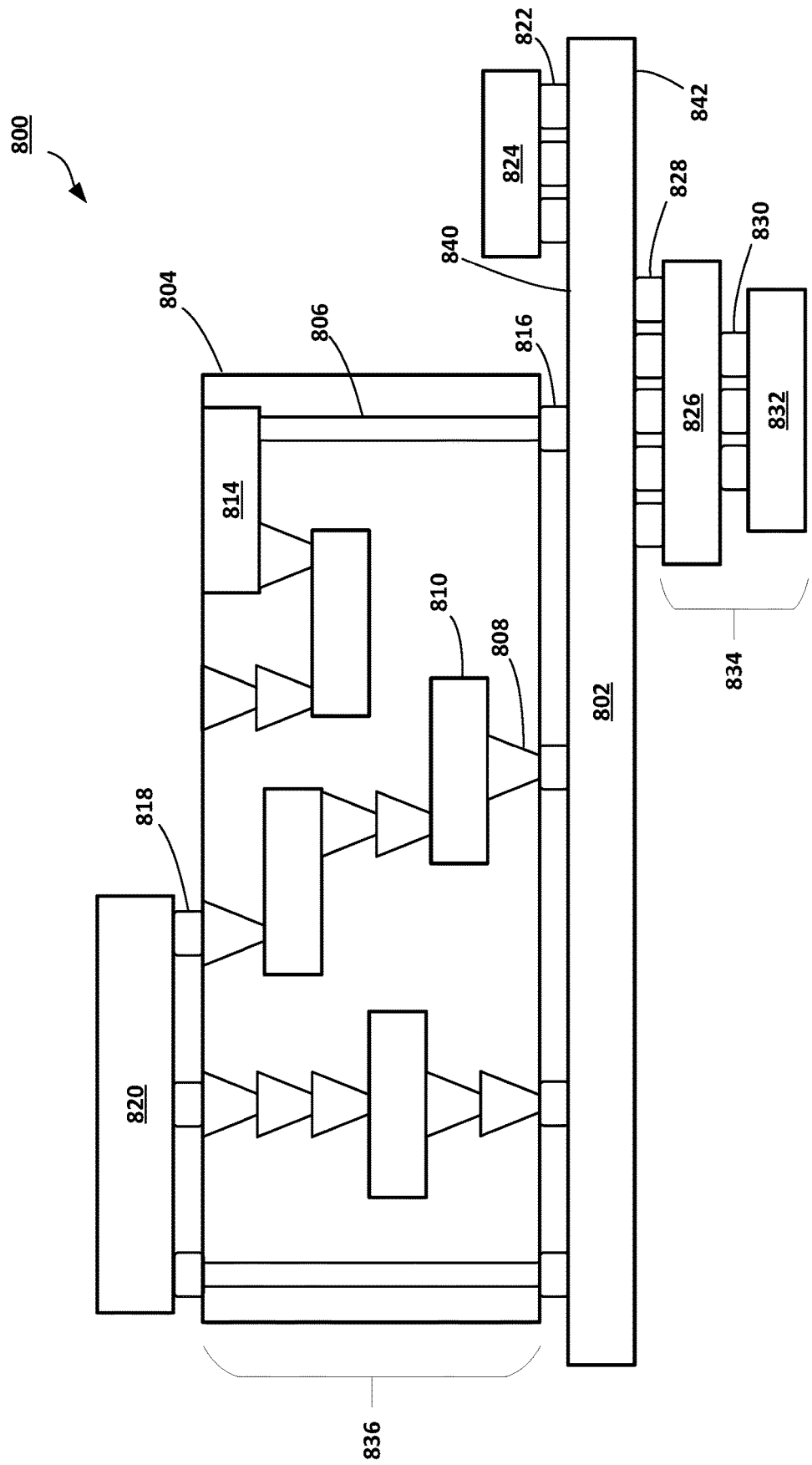
FIG. 8 is a cross-sectional side view of a device assembly that may include one or more optical receiver packages with backside lens-integrated PD dies in accordance with any of the embodiments disclosed herein.
Figure 9:
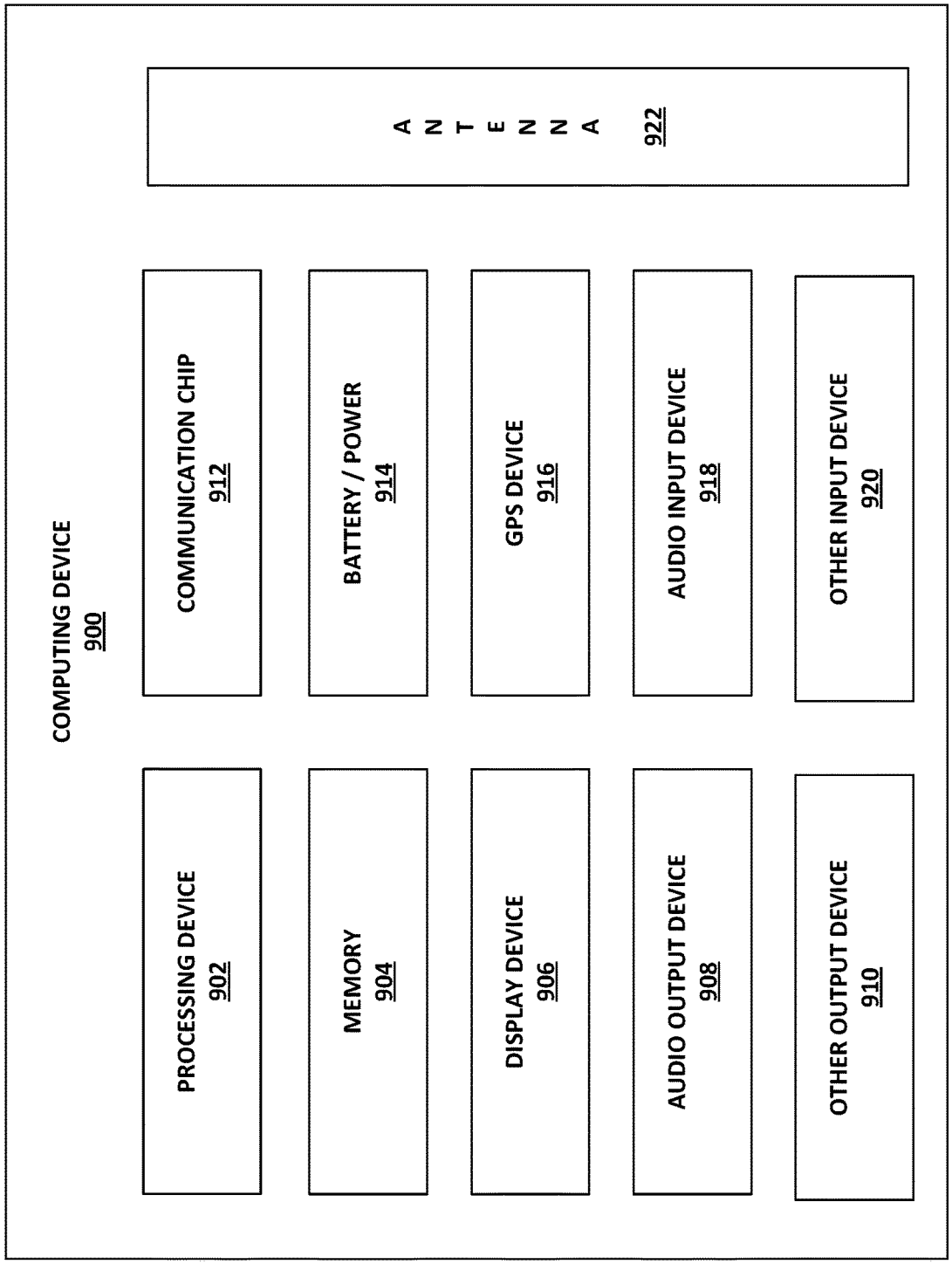
FIG. 9 is a block diagram of an example computing device that may include one or more optical receiver packages with backside lens-integrated PD dies in accordance with any of the embodiments disclosed herein.

The optical receiver packages with backside lens-integrated PD dies disclosed herein, e.g., any of the embodiments of the optical receiver packages or components shown in FIGS. 2 & 4-5 or any further embodiments described herein, may be included in any suitable electronic/photonic component. FIGS. 7-9 illustrate various examples of packages, assemblies, and devices that may be used with or include any of the optical receiver packages with backside lens-integrated PD dies as disclosed herein.

FIG. 7 is a side, cross-sectional view of an example IC package 700 that may include optical receiver packages with backside lens-integrated PD dies in accordance with any of the embodiments disclosed herein. In some embodiments, the IC package 700 may be a system-in-package (SiP).

As shown in FIG. 7, the package substrate 752 may be formed of a dielectric material (e.g., a ceramic, a buildup film, an epoxy film having filler particles therein, etc.), and may have conductive pathways extending through the dielectric material between the face 772 and the face 774, or between different locations on the face 772, and/or between different locations on the face 774. These conductive pathways may take the form of any of the interconnect structures comprising lines and/or vias, e.g., as discussed above with reference to FIG. 1.

The package substrate 752 may include conductive contacts 763 that are coupled to conductive pathways 762 through the package substrate 752, allowing circuitry within the dies 756 and/or the interposer 757 to electrically couple to various ones of the conductive contacts 764 (or to other devices included in the package substrate 752, not shown).

The IC package 700 may include an interposer 757 coupled to the package substrate 752 via conductive contacts 761 of the interposer 757, first-level interconnects 765, and the conductive contacts 763 of the package substrate 752. The first-level interconnects 765 illustrated in FIG. 7 are solder bumps, but any suitable first-level interconnects 765 may be used, such as solder bumps, solder posts, or bond wires. In the embodiments where the interposer 757 is used, the interposer 757 may be the support structure 102, described above.

The IC package 700 may include one or more dies 756 coupled to the interposer 757 via conductive contacts 754 of the dies 756, first-level interconnects 758, and conductive contacts 760 of the interposer 757. The conductive contacts 760 may be coupled to conductive pathways (not shown) through the interposer 757, allowing circuitry within the dies 756 to electrically couple to various ones of the conductive contacts 761 (or to other devices included in the interposer 757, not shown). The first-level interconnects 758 illustrated in FIG. 7 are solder bumps, but any suitable first-level interconnects 758 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 766 may be disposed between the package substrate 752 and the interposer 757 around the first-level interconnects 765, and a mold compound 768 may be disposed around the dies 756 and the interposer 757 and in contact with the package substrate 752. In some embodiments, the underfill material 766 may be the same as the mold compound 768. Example materials that may be used for the underfill material 766 and the mold compound 768 are epoxy mold materials, as suitable. Second-level interconnects 770 may be coupled to the conductive contacts 764. The second-level interconnects 770 illustrated in FIG. 7 are solder balls (e.g., for a ball grid array arrangement), but any suitable second-level interconnects 770 may be used (e.g., pins in a pin grid array arrangement or lands in a land grid array arrangement). The second-level interconnects 770 may be used to couple the IC package 700 to another component, such as a circuit board (e.g., a motherboard), an interposer, or another IC package, as known in the art and as discussed below with reference to FIG. 8.

In various embodiments, any of the dies 756 may include the PD die 202 as described herein, aligned with the optical input device 110, as described herein. The details of the PD die 104 and the optical input device 110 are not specifically shown in FIG. 7 in order to not clutter the drawing. However, in all such embodiments, for the dies 756 that are implemented as the PD die 104, the conductive contacts 754 of the die 756 may be analogous to the conductive contacts 120 described above, the interconnects 758 may be analogous to the interconnects 128 described above, and the conductive contacts 760 of the interposer 757 may be analogous to the conductive contacts 126 described above.

In embodiments in which the IC package 700 includes multiple dies 756, the IC package 700 may be referred to as a multi-chip package (MCP). The dies 756 may include circuitry to perform any desired functionality. For example, besides one or more of the dies 756 being PD dies 104 as described herein, one or more of the dies 756 may be logic dies (e.g., silicon-based dies), one or more of the dies 756 may be memory dies (e.g., high bandwidth memory), etc. In some embodiments, any of the dies 756 which are implemented as PD dies 104 may include one or more associated optical input devices 110, e.g., as discussed with reference to FIGS. 1-3. In some embodiments, at least some of the dies 756 may not include any PDs or any backside integrated lenses as described herein.

Although the IC package 700 illustrated in FIG. 7 is a flip-chip package, other package architectures may be used. For example, the IC package 700 may be a ball grid array (BGA) package, such as an embedded wafer-level ball grid array (eWLB) package. In another example, the IC package 700 may be a wafer-level chip scale package (WLCSP) or a panel fan-out (FO) package. Although two dies 756 are illustrated in the IC package 700 of FIG. 7, an IC package 700 may include any desired number of dies 756. An IC package 700 may include additional passive components, such as surface-mount resistors, capacitors, and inductors disposed on the first face 772 or the second face 774 of the package substrate 752, or on either face of the interposer 757. More generally, an IC package 700 may include any other active or passive components known in the art.

In some embodiments, no interposer 757 may be included in the IC package 700; instead, the dies 756 may be coupled directly to the conductive contacts 763 at the face 772 by first-level interconnects 765. In such embodiments, the package substrate 752 may be analogous to the support structure 102 described above, and, for the dies 756 that are implemented as the PD die 104 optically coupled to the optical input device 110, the conductive contacts 754 of the dies 756 may be analogous to the conductive contacts 120 described above, the interconnects 765 may be analogous to the interconnects 128 described above, and the conductive contacts 763 of the package substrate 752 may be analogous to the conductive contacts 126 described above.

FIG. 8 is a cross-sectional side view of an IC device assembly 800 that may include components having one or more optical receiver packages with backside lens-integrated PD dies in accordance with any of the embodiments disclosed herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802; generally, components may be disposed on one or both faces 840 and 842. In particular, any suitable ones of the components of the IC device assembly 800 may include any of the one or more optical receiver packages with a backside lens-integrated PD die in accordance with any of the embodiments disclosed herein; e.g., any of the IC packages discussed below with reference to the IC device assembly 800 may take the form of any of the embodiments of the IC package 700 discussed above with reference to FIG. 7.

In some embodiments, the circuit board 802 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

FIG. 8 illustrates that, in some embodiments, the IC device assembly 800 may include a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 7), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. In some embodiments, the IC package 820 may be or include the IC package 700, e.g., as described above with reference to FIG. 7. In some embodiments, the IC package 820 may include at least one PD die 104 as described herein, optically coupled to the optical input device 110, as described herein. The PD die 104 and the optical input device 110 are not specifically shown in FIG. 8 in order to not clutter the drawing.

Although a single IC package 820 is shown in FIG. 8, multiple IC packages may be coupled to the interposer 804; indeed, additional interposers may be coupled to the interposer 804. The interposer 804 may provide an intervening substrate used to bridge the circuit board 802 and the IC package 820. Generally, the interposer 804 may spread a connection to a wider pitch or reroute a connection to a different connection. For example, the interposer 804 may couple the IC package 820 to a BGA of the coupling components 816 for coupling to the circuit board 802. In such an example, the interposer 804 may be analogous to the support structure 102, described above.

In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to TSVs 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

In some embodiments, the IC device assembly 800 may include an IC package 89 coupled to the first face 840 of the circuit board 802 by coupling components 87. The coupling components 822 may take the form of any of the embodiments discussed above with reference to the coupling components 816, and the IC package 824 may take the form of any of the embodiments discussed above with reference to the IC package 820.

In some embodiments, the IC device assembly 800 may include a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and/or 832 may take the form of any of the embodiments of the IC package 820 discussed above. The package-on-package structure 834 may be configured in accordance with any of the package-on-package structures known in the art.

FIG. 9 is a block diagram of an example computing device 900 that may include one or more components having one or more optical receiver packages with backside lens-integrated PD dies in accordance with any of the embodiments disclosed herein. For example, any suitable ones of the components of the computing device 900 may include a PD die (e.g., the PD die 202 as shown in FIGS. 2A-C) having an optical element (e.g., the lens 202 or mirror 224) integrated on its' backside, opposite the PD implemented at the other side of the PD die (e.g., the PD 106), in accordance with any of the embodiments disclosed herein. In another example, any one or more of the components of the computing device 900 may include any embodiments of the IC package 700 (e.g., as shown in FIG. 7). In yet another example, any one or more of the components of the computing device 900 may include an IC device assembly 800 (e.g., as shown in FIG. 8).

A number of components are illustrated in FIG. 9 as included in the computing device 900, but any one or more of these components may be omitted or duplicated, as suitable for the application. In some embodiments, some or all of the components included in the computing device 900 may be attached to one or more motherboards. In some embodiments, some or all of these components are fabricated onto a single system-on-a-chip (SoC) die.

Additionally, in various embodiments, the computing device 900 may not include one or more of the components illustrated in FIG. 9, but the computing device 900 may include interface circuitry for coupling to the one or more components. For example, the computing device 900 may not include a display device 906, but may include display device interface circuitry (e.g., a connector and driver circuitry) to which a display device 906 may be coupled. In another set of examples, the computing device 900 may not include an audio input device 918 or an audio output device 908, but may include audio input or output device interface circuitry (e.g., connectors and supporting circuitry) to which an audio input device 918 or audio output device 908 may be coupled.

The computing device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 904 may include memory that shares a die with the processing device 902. This memory may be used as cache memory and may include embedded dynamic random access memory (eDRAM) or spin transfer torque magnetic random access memory (STT-M RAM).

In some embodiments, the computing device 900 may include a communication chip 912 (e.g., one or more communication chips). For example, the communication chip 912 may be configured for managing wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other embodiments. The computing device 900 may include an antenna 9227 to facilitate wireless communications and/or to receive other wireless communications (such as AM or FM radio transmissions).

In some embodiments, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as global positioning system (GPS), EDGE, GPRS, CDMA, WiMAX, LTE, EV-DO, or others. In some embodiments, a first communication chip 912 may be dedicated to wireless communications, and a second communication chip 912 may be dedicated to wired communications.

The computing device 900 may include battery/power circuitry 914. The battery/power circuitry 914 may include one or more energy storage devices (e.g., batteries or capacitors) and/or circuitry for coupling components of the computing device 900 to an energy source separate from the computing device 900 (e.g., AC line power).

The computing device 900 may include a display device 906 (or corresponding interface circuitry, as discussed above). The display device 906 may include any visual indicators, such as a heads-up display, a computer monitor, a projector, a touchscreen display, a liquid crystal display (LCD), a light-emitting diode display, or a flat panel display, for example.

The computing device 900 may include an audio output device 908 (or corresponding interface circuitry, as discussed above). The audio output device 908 may include any device that generates an audible indicator, such as speakers, headsets, or earbuds, for example.

The computing device 900 may include an audio input device 918 (or corresponding interface circuitry, as discussed above). The audio input device 918 may include any device that generates a signal representative of a sound, such as microphones, microphone arrays, or digital instruments (e.g., instruments having a musical instrument digital interface (MIDI) output).

The computing device 900 may include a GPS device 916 (or corresponding interface circuitry, as discussed above). The GPS device 916 may be in communication with a satellite-based system and may receive a location of the computing device 900, as known in the art.

The computing device 900 may include an other output device 910 (or corresponding interface circuitry, as discussed above). Examples of the other output device 910 may include an audio codec, a video codec, a printer, a wired or wireless transmitter for providing information to other devices, or an additional storage device.

The computing device 900 may include an other input device 920 (or corresponding interface circuitry, as discussed above). Examples of the other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 900 may have any desired form factor, such as a handheld or mobile computing device (e.g., a cell phone, a smart phone, a mobile Internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 900 may be any other electronic device that processes data.

Figure 10:
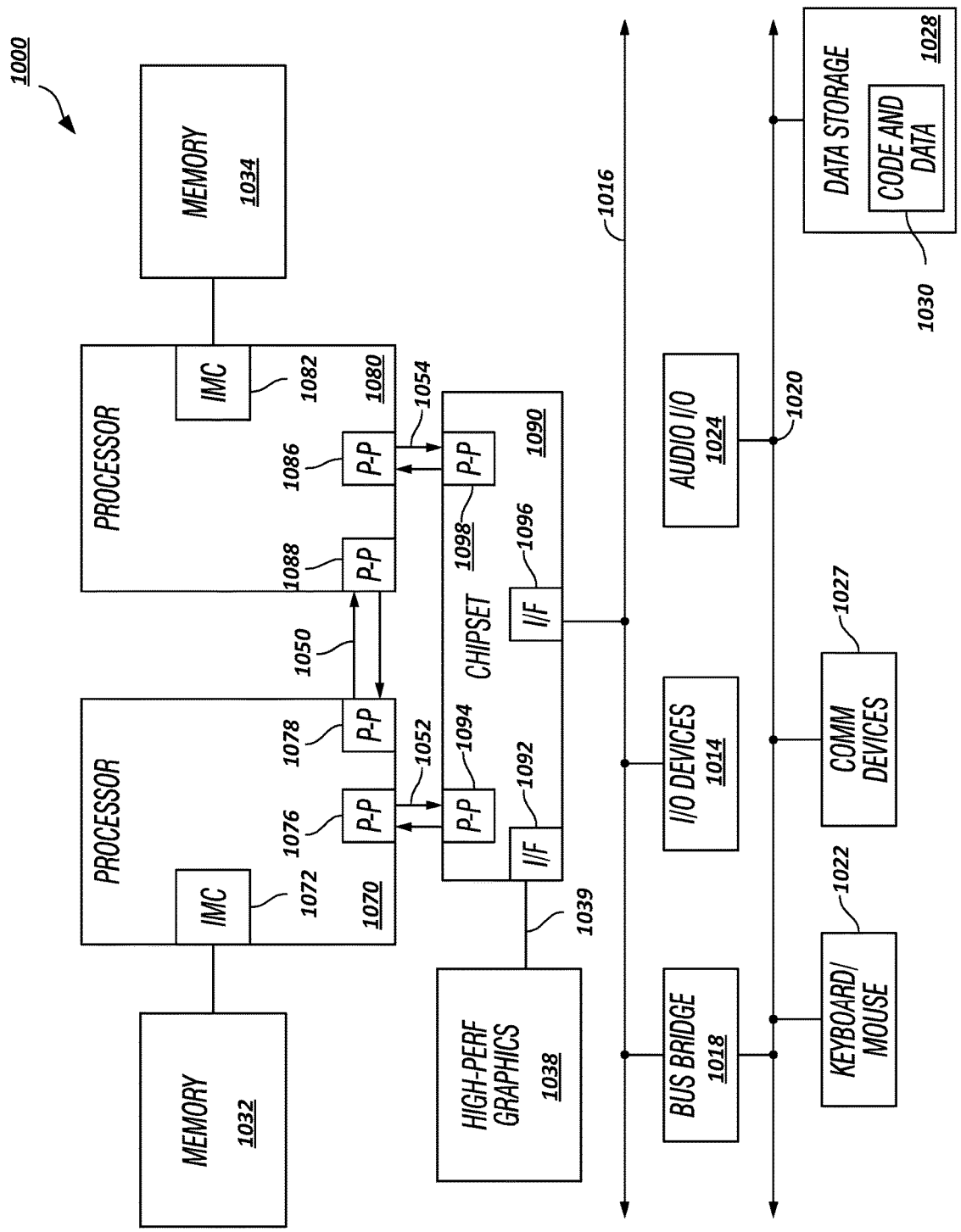
FIG. 10 illustrates an embodiment of a block for a computing system including multiple processor sockets.

Referring now to FIG. 10, shown is a block diagram of a second system 1000 in accordance with an embodiment of the present invention. As shown in FIG. 10, multiprocessor system 1000 is a point-to-point interconnect system, and includes a first processor 1070 and a second processor 1080 coupled via a point-to-point interconnect 1050. Each of processors 1070 and 1080 may be some version of a processor. In one embodiment, 1052 and 1054 are part of a serial, point-to-point coherent interconnect fabric, such as Intel's Quick Path Interconnect (QPI) architecture. As a result, the invention may be implemented within the QPI architecture.

While shown with only two processors 1070, 1080, it is to be understood that the scope of the present invention is not so limited. In other embodiments, one or more additional processors may be present in a given processor.

Processors 1070 and 1080 are shown including integrated memory controller units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 each exchange information with a chipset 1090 via individual P-P interfaces 1052, 1054 using point to point interface circuits 1076, 1094, 1086, 1098. Chipset 1090 also exchanges information with a high-performance graphics circuit 1038 via an interface circuit 1092 along a high-performance graphics interconnect 1039.

A shared cache (not shown) may be included in either processor or outside of both processors; yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present invention is not so limited.

As shown in FIG. 10, various I/O devices 1014 are coupled to first bus 1016, along with a bus bridge 1018 which couples first bus 1016 to a second bus 1020. In one embodiment, second bus 1020 includes a low pin count (LPC) bus. Various devices are coupled to second bus 1020 including, for example, a keyboard and/or mouse 1022, communication devices 1027 and a storage unit 1028 such as a disk drive or other mass storage device which often includes instructions/code and data 1030, in one embodiment. Further, an audio I/O 1024 is shown coupled to second bus 1020. Note that other architectures are possible, where the included components and interconnect architectures vary. For example, instead of the point-to-point architecture of FIG. 10, a system may implement a multi-drop bus or other such architecture.

Figure 11:
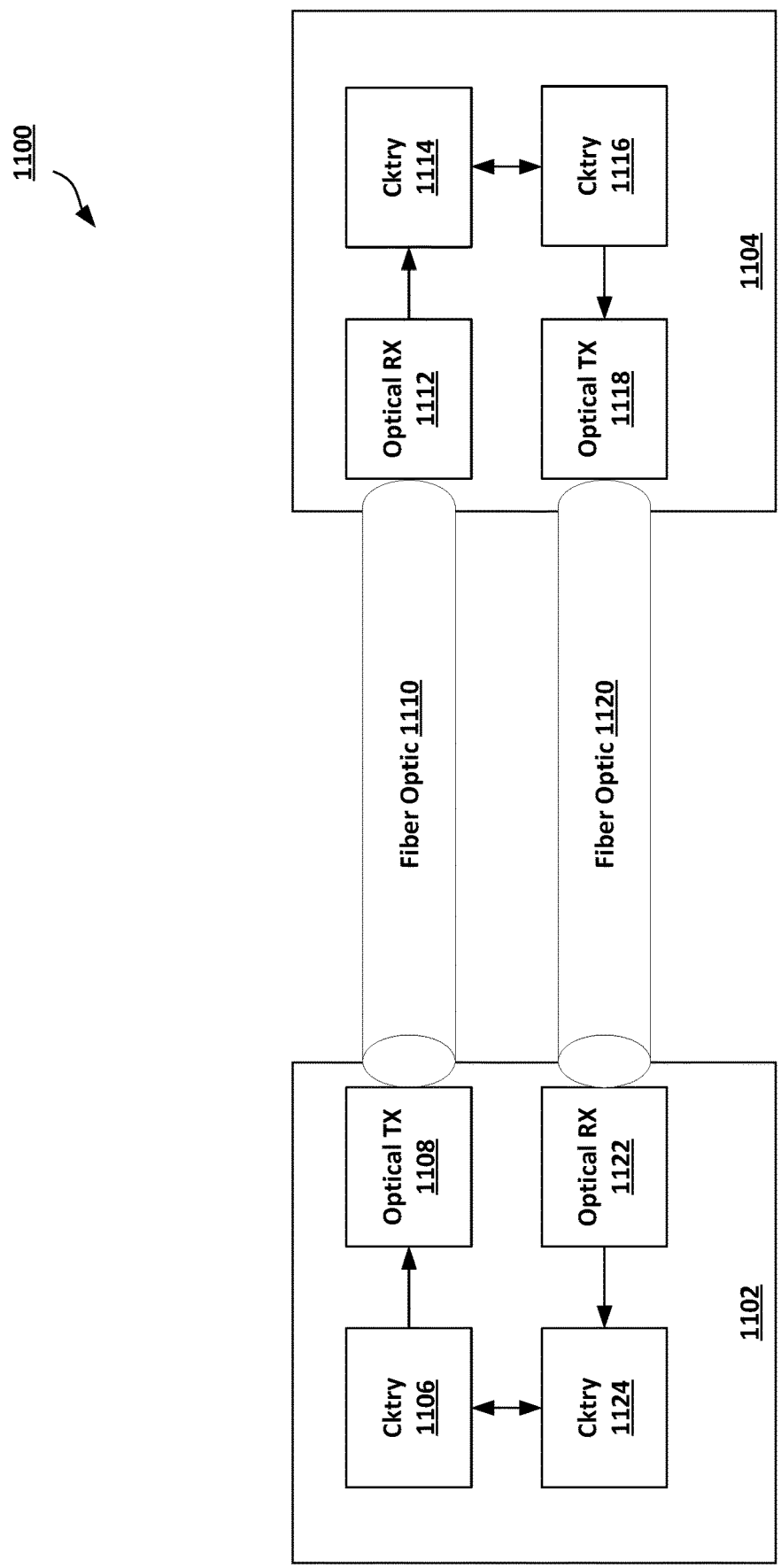
FIG. 11 is a schematic diagram of an example fiber optic network in accordance with embodiments of the present disclosure.

FIG. 11 is a schematic diagram of an example fiber optic network 1100 in accordance with embodiments of the present disclosure. The fiber optic network 1100 can include two or more devices, such as device 1102 and device 1104. Devices 1102 and 1104 can be servers, computing devices, add-in cards, peripheral devices, graphics cards, motherboards, communications devices, communications hubs, switches, patch panels, cabinets, etc.

Device 1102 can include one or more photonic devices to create and/or transmit light signals across an optical fiber. For example, the device 1102 can include circuitry 1106 that can include one or more processors, protocol stacks, memory, etc., that can create an electrical signal representative of information to be communicated. The circuitry 1106 can be coupled to a photonic device optical transmitter 1108. The optical transmitter 1108 can transmit a light signal that represents the information created by the circuitry 1106. The optical transmitter 1108 can send light signal through optical fiber 1110. Device 1104 can receive the light signal at an optical receiver assembly 1112, which can be similar to optical receiver assemblies described herein. The optical receiver assembly 1112 can receive light signals at a PD and the PD can turn the light signals into electrical signals, that are sent to and processed by circuitry 1114.

Likewise, device 1104 can include circuitry 1116 to create an electrical signal representative of information to be communicated across the fiber optic network 1000. The device 1104 can include a photonic device that includes an optical transmitter 1118 that can create light signals representative of the information to be communicated. The optical transmitter 1118 can sends the light signals through the optical fiber 1120. An optical receiver assembly 1122 can receive the light signal. Optical receiver assembly 1122 can be similar to optical receiver assemblies described above. A PD of the optical receiver assembly 1122 can turn the received light signals into electrical signals, which are received and processed by circuitry 1124.

Figure 12:
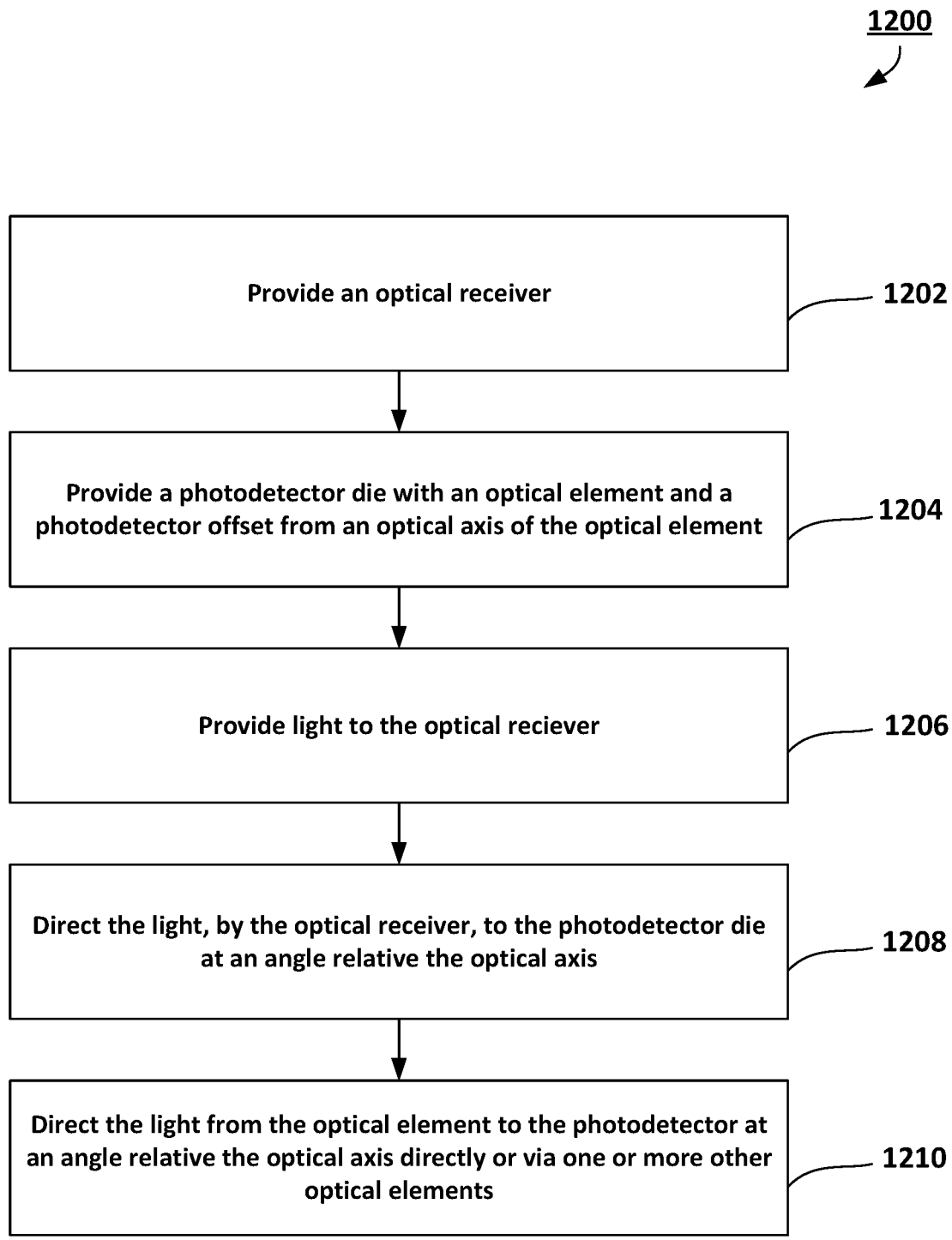
FIG. 12 is a process flow diagram for providing an optical receiving assembly in accordance with embodiments of the present disclosure.

FIG. 12 is a process flow diagram 1200 for providing an optical receiving assembly in accordance with embodiments of the present disclosure. An optical receiver assembly can include an optical receiver and a photodetector die. An optical receiver can be provided (1202). The optical receiver can include a waveguide for directing a light signal from a light source, such as a photonic device or optical fiber, towards an optical element within the optical receiver. The optical element can be turning mirror to direct light from the waveguide and out of the optical receiver. In some embodiments, the optical receiver includes a lid, such as a glass or other optical material lid, and the optical element directs light from the waveguide through the lid and out of the receiver.

A photodetector (PD) die can also be provided (1204). The PD die can include an optical element, such as a lens or mirror, that directs light to a photodetector. The lens or mirror can be on a same side of the PD or on opposite sides of the photodetector (e.g., on opposite sides of the photodetector die). The PD is positioned offset from the optical element in the PD die relative the optical axis of the optical element.

When light is propagated through the waveguide (1206), light is directed from the waveguide through the optical receiver (e.g., the lid) and into the either the optical element of the PD die or into the PD die itself (1208). The optical element either directly or through intermediate optics, directs the light to the PD (1210).

In the written description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "AB/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometers. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The following paragraphs provide various examples of the embodiments disclosed herein.

Example 1 is an apparatus comprising a photodetector (PD) die comprising an optical element formed on a first side of the PD die; and a photodetector disposed on a second side of the PD die, the first side opposite the second side, wherein the photodetector is disposed on the second side of the PD die offset from an optical axis of the optical element.

Example 2 may include the subject matter of example 1, wherein the optical element comprises a lens.

Example 3 may include the subject matter of example 2, wherein the lens comprises a lens sag and a clear aperture, wherein the ratio of lens sag to clear aperture is less than 1:10.

Example 4 may include the subject matter of any of examples 1 or 2, wherein the lens comprises a radius of curvature less than 300 microns and a clear aperture of about 120 microns.

Example 5 may include the subject matter of example 1, wherein the optical element comprises a concave mirror.

Example 6 may include the subject matter of example 6, further comprising a flat or folding mirror disposed on the second side of the PD die, the flat or folding mirror to direct light to the concave mirror.

Example 7 may include the subject matter of any of examples 6, wherein the concave mirror comprises a sag of less than 4 microns.

Example 8 may include the subject matter of any of examples 1-7, wherein the PD comprises one of a photodiode or a phototransistor.

Example 9 may include the subject matter of any of examples 1-8, further comprising a planarization layer formed on the first side of the PD die.

Example 10 may include the subject matter of any of examples 1-9, wherein the PD comprises a diameter of 13 microns or less.

Example 11 is a system comprising a optical receiver comprising an optical waveguide, an optical lid adjacent the waveguide, and a reflective surface proximate an output of the optical waveguide to direct light from the waveguide towards an output of the optical lid. The system can include a photodetector (PD) die comprising a substrate, a concave mirror, and a photodetector. The concave mirror can be formed on a first side of the substrate and the photodetector is disposed on a second side of the substrate, the first side opposite the second side, wherein the photodetector is disposed on the second side of the PD die offset from the optical axis of the optical element.

Example 12 may include the subject matter of example 11, further comprising a flat or folding mirror disposed on the second side of the PD die, the flat or folding mirror to direct light to the concave mirror.

Example 13 may include the subject matter of any of examples 11 or 12, wherein the concave mirror comprises a sag of less than 4 microns.

Example 14 may include the subject matter of any of examples 11-13, wherein the PD comprises one of a photodiode or a phototransistor.

Example 15 may include the subject matter of any of examples 11-14, further comprising a planarization layer formed on the first side of the PD die.

Example 16 may include the subject matter of any of examples 11-15, wherein the PD comprises a diameter of 13 microns or less.

Example 17 may include the subject matter of any of examples 11-16, wherein the optical receiver comprises a receiver for a fiber optic cable, the waveguide coupled to an output of the fiber optic cable to receive light from the fiber optic cable.

Example 18 may include the subject matter of any of examples 11-18, wherein the optical receiver is separated from the PD die by an airgap.

Example 19 may include the subject matter of example 18, wherein the airgap is about 150 microns.

Example 20 is a photonic device comprising a fiber optic receiver; and a photodetector die, the photodetector die comprising a shallow optical element comprising low sag relative to a radius of curvature of the shallow optical element, and a photodetector to receive light from the shallow optical element, the photodetector offset from an optical axis of the shallow optical element. The shallow optical element is to direct light from the fiber optic receiver to the photodetector.

Example 21 may include the subject matter of example 20, wherein the shallow optical element comprises a concave mirror, and the photodetector die comprises a flat or folding mirror to direct light from the fiber optic receiver to the concave mirror.

Example 22 is an apparatus that includes a shallow optical element and a photodetector offset from an optical axis of the shallow lens. The apparatus can include an optical receiver device that includes a means for directing light toward the shallow optical element. The shallow optical element can be a shallow lens or a shallow mirror. The shallow optical element is formed on a semiconductor substrate, and the photodetector is formed or positioned on the semiconductor substrate offset from the optical elements optical axis. The photodetector can be on the same surface of the substrate or can be on an opposite surface than the shallow optical element.

What is claimed is:

1. An apparatus comprising:
   a photodetector (PD) die comprising:
      an optical element formed on a first side of the PD die; and
      a photodetector disposed on a second side of the PD die, the first side opposite the second side, wherein the photodetector is disposed on the second side of the PD die offset from an optical axis of the optical element,
   wherein the optical element comprises a sag and a clear aperture, wherein a ratio of sag to clear aperture is less than 1:10.

2. The apparatus of claim 1, wherein the optical element comprises a lens.

3. The apparatus of claim 2, wherein the lens comprises a lens sag, wherein a ratio of lens sag to clear aperture is less than 1:10.

4. The apparatus of claim 2, wherein the lens comprises a radius of curvature less than 300 microns and a clear aperture of about 120 microns.

5. The apparatus of claim 1, wherein the optical element comprises a concave mirror.

6. The apparatus of claim 5, further comprising a flat or folding mirror disposed on the second side of the PD die, the flat or folding mirror to direct light to the concave mirror.

7. The apparatus of claim 5, wherein the concave mirror comprises a sag of less than 4 microns.

8. The apparatus of claim 1, wherein the PD die comprises one of a photodiode or a phototransistor.

9. The apparatus of claim 1, wherein the PD die comprises a diameter of 13 microns or less.

10. The apparatus of claim 1, wherein the PD die comprises an array of optical elements formed on the first side of the PD die and an array of photodetectors disposed on the second side, wherein the array of optical elements comprises the optical element, wherein the array of photodetectors comprises the photodetector,
    wherein individual optical elements of the array of optical elements have a physical aperture less than 150 micrometers, wherein a pitch of the array of optical elements is limited by the physical apertures of the array of optical elements.

11. The apparatus of claim 1, further comprising a planarization layer formed on the first side of the PD die, wherein the PD die has one or more edges, wherein the planarization layer does not extend past the one or more edges of the PD die.

12. A system comprising:
    a optical receiver comprising:
       an optical waveguide,
       an optical lid adjacent the waveguide, and
       a reflective surface proximate an output of the optical waveguide to direct light from the waveguide towards an output of the optical lid; and
    a photodetector (PD) die comprising:
       a substrate,
       a concave mirror, and
       a photodetector,
    wherein the concave mirror is formed on a first side of the substrate and the photodetector is disposed on a second side of the substrate, the first side opposite the second side, wherein the photodetector is disposed on the second side of the PD die offset from the optical axis of the concave mirror, wherein the concave mirror comprises a sag of less than 4 microns.

13. The system of claim 12, further comprising a flat or folding mirror disposed on the second side of the PD die, the flat or folding mirror to direct light to the concave mirror.

14. The system of claim 12, wherein the PD die comprises one of a photodiode or a phototransistor.

15. The system of claim 12, further comprising a planarization layer formed on the first side of the PD die.

16. The system of claim 12, wherein the PD die comprises a diameter of 13 microns or less.

17. The system of claim 12, wherein the optical receiver comprising a receiver for a fiber optic cable, the waveguide coupled to an output of the fiber optic cable to receive light from the fiber optic cable.

18. The system of claim 12, wherein the optical receiver is separated from the PD die by an airgap.

19. The system of claim 18, wherein the airgap is about 150 microns.

20. A photonic device comprising:
a fiber optic receiver; and
a photodetector die, the photodetector die comprising:
a shallow optical element comprising low sag relative to a radius of curvature of the shallow optical element, wherein the shallow optical element has a sag less than 10 micrometers, and
a photodetector to receive light from the shallow optical element, the photodetector offset from an optical axis of the shallow optical element;
wherein the shallow optical element is to direct light from the fiber optic receiver to the photodetector.

21. The photonic device of claim 20, wherein the shallow optical element comprises a concave mirror, and the photodetector die comprises a flat or folding mirror to direct light from the fiber optic receiver to the concave mirror.

* * * * *